United States Patent
Han et al.

(10) Patent No.: US 9,548,119 B2
(45) Date of Patent: Jan. 17, 2017

(54) MEMORY DEVICE COMPRISING AN ELECTRICALLY FLOATING BODY TRANSISTOR

(71) Applicant: Zeno Semiconductor, Inc., Cupertino, CA (US)

(72) Inventors: Jin-Woo Han, San Jose, CA (US); Yuniarto Widjaja, San Jose, CA (US)

(73) Assignee: Zeno Semiconductor, Inc, Sunnyvale, CA (US)

( * ) Notice: Subject to any disclaimer, the term of this patent is extended or adjusted under 35 U.S.C. 154(b) by 0 days.

(21) Appl. No.: 14/597,444

(22) Filed: Jan. 15, 2015

(65) Prior Publication Data

US 2015/0200005 A1 Jul. 16, 2015

Related U.S. Application Data

(60) Provisional application No. 61/927,484, filed on Jan. 15, 2014.

(51) Int. Cl.
| | | |
|---|---|---|
| *G11C 15/04* | (2006.01) | |
| *G11C 11/404* | (2006.01) | |
| *G11C 11/4091* | (2006.01) | |
| *G11C 11/412* | (2006.01) | |

(52) U.S. Cl.
CPC ............. *G11C 15/04* (2013.01); *G11C 11/404* (2013.01); *G11C 11/4091* (2013.01); *G11C 11/412* (2013.01); *G11C 15/043* (2013.01)

(58) Field of Classification Search
CPC ...... G11C 11/401; G11C 11/404; G11C 15/04; G11C 15/043; G11C 15/046; H01L 29/7841; H01L 29/78606; H01L 29/78609; H01L 27/1207; H01L 27/10802

See application file for complete search history.

(56) References Cited

U.S. PATENT DOCUMENTS

| | | |
|---|---|---|
| 4,300,212 A | 11/1981 | Simko |
| 4,959,812 A | 9/1990 | Momodomi et al. |
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |

(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.

(Continued)

*Primary Examiner* — Allison P Bernstein
(74) *Attorney, Agent, or Firm* — Alan W. Cannon; Law Office of Alan W. Cannon

(57) ABSTRACT

A memory cell comprising includes a silicon-on-insulator (SOI) substrate, an electrically floating body transistor fabricated on the silicon-on-insulator (SOI) substrate, and a charge injector region. The floating body transistor is configured to have more than one stable state through an application of a bias on the charge injector region.

21 Claims, 32 Drawing Sheets

(56) References Cited

U.S. PATENT DOCUMENTS

| | | | |
|---|---|---|---|
| 6,166,407 A | 12/2000 | Ohta | |
| 6,277,689 B1 | 8/2001 | Wong | |
| 6,341,087 B1 | 1/2002 | Kunikiyo et al. | |
| 6,349,049 B1 * | 2/2002 | Schoy | G11C 15/04 365/203 |
| 6,356,485 B1 | 3/2002 | Proebsting et al. | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,835,979 B1 | 12/2004 | Liu et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,030,435 B2 | 4/2006 | Gnadinger | |
| 7,085,156 B2 | 8/2006 | Ferrant et al. | |
| 7,109,532 B1 * | 9/2006 | Lee | H01L 29/7841 257/133 |
| 7,118,986 B2 | 10/2006 | Steigerwalt et al. | |
| 7,170,807 B2 | 1/2007 | Fazan et al. | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,301,195 B2 * | 11/2007 | Nakajima | G11C 16/3431 257/314 |
| 7,301,803 B2 | 11/2007 | Okhonin et al. | |
| 7,329,580 B2 | 2/2008 | Cho et al. | |
| 7,376,006 B2 | 5/2008 | Bednorz et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Mathew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,701,763 B2 | 4/2010 | Roohparvar | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 7,924,630 B2 | 4/2011 | Carman | |
| 7,933,140 B2 | 4/2011 | Wang et al. | |
| 8,014,200 B2 | 9/2011 | Widjaja | |
| 8,036,033 B2 | 10/2011 | Widjaja | |
| 8,059,459 B2 | 11/2011 | Widjaja | |
| 8,077,536 B2 | 12/2011 | Widjaja | |
| 8,130,547 B2 | 3/2012 | Widjaja et al. | |
| 8,130,548 B2 | 3/2012 | Widjaja et al. | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,208,302 B2 | 6/2012 | Widjaja et al. | |
| 8,243,499 B2 | 8/2012 | Widjaja | |
| 8,294,193 B2 | 10/2012 | Widjaja | |
| 8,305,803 B2 * | 11/2012 | Mazure | G11C 11/404 257/273 |
| 8,391,059 B2 * | 3/2013 | Lu | G11C 11/404 365/129 |
| 8,391,066 B2 | 3/2013 | Widjaja | |
| 8,472,249 B2 | 6/2013 | Widjaja | |
| 8,514,622 B2 | 8/2013 | Widjaja | |
| 8,514,623 B2 | 8/2013 | Widjaja et al. | |
| 8,531,881 B2 | 9/2013 | Widjaja | |
| 8,559,257 B2 | 10/2013 | Widjaja | |
| 8,570,803 B2 | 10/2013 | Widjaja | |
| 8,582,359 B2 | 11/2013 | Widjaja | |
| 8,654,583 B2 | 2/2014 | Widjaja | |
| 8,711,622 B2 | 4/2014 | Widjaja | |
| 8,767,458 B2 | 7/2014 | Widjaja | |
| 8,787,085 B2 | 7/2014 | Widjaja | |
| 8,837,247 B2 | 9/2014 | Widjaja | |
| 8,923,052 B2 | 12/2014 | Widjaja | |
| 8,934,296 B2 | 1/2015 | Widjaja | |
| 8,937,834 B2 | 1/2015 | Widjaja et al. | |
| 8,957,458 B2 | 2/2015 | Widjaja | |
| 8,995,186 B2 | 3/2015 | Widjaja | |
| 9,001,581 B2 | 4/2015 | Widjaja | |
| 9,025,358 B2 | 5/2015 | Widjaja | |
| 9,029,922 B2 | 5/2015 | Han et al. | |
| 9,030,872 B2 | 5/2015 | Widjaja et al. | |
| 2002/0018366 A1 | 2/2002 | Von Schwerin et al. | |
| 2002/0048193 A1 | 4/2002 | Tanikawa et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0123418 A1 | 5/2008 | Widjaja | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0246277 A1 | 9/2010 | Widjaja | |
| 2010/0246284 A1 | 9/2010 | Widjaja | |
| 2011/0032756 A1 * | 2/2011 | Widjaja | G11C 11/404 365/182 |
| 2011/0042736 A1 | 2/2011 | Widjaja | |
| 2011/0044110 A1 | 2/2011 | Widjaja | |
| 2011/0228591 A1 | 9/2011 | Widjaja | |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0120752 A1 * | 5/2012 | Widjaja | G11C 8/10 365/230.05 |
| 2012/0217549 A1 | 8/2012 | Widjaja | |
| 2012/0230123 A1 | 9/2012 | Widjaja et al. | |
| 2013/0015517 A1 | 1/2013 | Widjaja et al. | |
| 2013/0148422 A1 | 6/2013 | Widjaja | |
| 2013/0250685 A1 | 9/2013 | Widjaja | |
| 2013/0264656 A1 | 10/2013 | Widjaja et al. | |
| 2013/0292635 A1 | 11/2013 | Widjaja | |
| 2013/0301349 A1 | 11/2013 | Widjaja | |
| 2014/0021549 A1 | 1/2014 | Widjaja | |

(56) References Cited

U.S. PATENT DOCUMENTS

| | | |
|---|---|---|
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |

OTHER PUBLICATIONS

Campardo G. et al., VLSI Design of Non-Volatile Memories, 2005.

Han et al. Programming/Erasing Characteristics of 45 nm NOR-Type Flash Memory Based on SOI FinFET Structure. vol. 47, Nov. 2005, pp. S564-S567.

Headland. Hot electron injection, Feb. 19, 2004.

Lanyon, et al., "Bandgap Narrowing in Moderately to Heavily Doped Silicon", ppl 1014-1018, No. 7, vol. ED-26, 1979.

Lin, et al., A new 1T DRAM Cell with enhanced Floating Body Effect, pp. 1-5, 2006.

Oh, et al., A 4-Bit Double SONOS memory (DSM) with 4 Storage Nodes Per Cell for Ultimate Multi-Bit Operation, pp. 1-2, 2006.

Ohsawa et al., An 18.5ns 128Mb SOI DRAM with a Floating body Cell, IEEE International Solid-State Circuits Conference, 2005, pp. 458-459, 609.

Ohsawa, et al. Autonomous refresh of floating body cell (FBC), 2008, pp. 801-804.

Ohsawa, et al. Autonomous refresh of floating-body cell due to current Anomaly of Impact Ionization, 2009, pp. 2302-2311.

Ohsawa et al., Memory Design Using One-Transistor Gain Cell on SOI, Tech. Digest, IEEE International Solid-State Circuits, vol. 37, No. 11, 2002, pp. 1510-1522.

Ohsawa, et al, "A Novel Capacitor-less DRAM Cell: Floating Body Cell", CRC Press, Taylor & Francis Group, 2012, pp. 1-7.

Okhonin, et al. A Capicitor-Less IT-DRAM Cell, vol. 23, No. 2, Feb. 2002, pp. 85-87.

Okhonin et al. A SOI Capacitor-less 1T-DRAM Concept. 2001, pp. 153-154.

Okhonin, et al., Principles of Transient Charge Pumping on Partially Depleted SOI MOSFETs, IEEE Electron Device Letters, vol. 23, No. 5, May 2002, pp. 279-281.

Rodriguez, et al. "A-RAM: Novel capacitor-less DRAM memory." In SOI Conference, 2009 IEEE International, pp. 1-2. IEEE, 2009.

Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.

Rodriguez, et al. "A-RAM memory cell: concept and operation." Electron Device Letters, IEEE, vol. 31, No. 9 (2010), pp. 972-974.

Robert F. Pierret. Semiconductor Device Fundamentals, ISBN: 0-201-54393-1, 1996, by Addison-Wesley Publishing Company, Inc. PNPN Devices 463-476.

Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.

Rothemund, et al., The importance of being modular, vol. 485, May 2012 pp. 584-585.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

Sakui, K., et al. "A new static memory cell based on the reverse base current effect of bipolar transistors." Electron Devices, IEEE Transactions on 36.6 (1989): 1215-1217.

Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.

Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.

Shin, et al. "A novel double HBT-based capacitorless 1T DRAM cell with Si/SiGe heterojunctions." Electron Device Letters, vol. 32, No. 7, 2011, pp. 850-852.

Sze, et al. Physics of Semiconductor Devices, 2007, pp. 1-4.

Tack, et al. "The multistable charge-controlled memory effect in SOI MOS transistors at low temperatures." Electron Devices, IEEE Transactions on 37.5 (1990): 1373-1382.

Terada, et al. "A new VLSI memory cell using capacitance coupling (CC cell)." Electron Devices, IEEE Transactions on 31.9 (1984): pp. 319-1324.

Ventrice, et al. "Analytical model of deeply-scaled thyristors for memory applications." Microelectronics and Electron Devices (WMED), 2012 IEEE Workshop on. IEEE, 2012, pp. 1-4.

Villaret, et al. "Further insight into the physics and modeling of floating-body capacitorless DRAMs." Electron Devices, IEEE Transactions on 52.11 (2005): pp. 2447-2454.

Waser, Rainer, Resistive non-volatile memory devices (Invited Paper), 2009, pp. 1925-1928.

Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.

Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.

Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.

Villaret et al., "Mechanisms of charge modulation in the floating body of triple-well nMOSFET capacitor-less DRAMs", Microelectronic Engineering 72 (2004) 434-439.

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.

Aoulaiche, et al. "Junction Field Effect on the Retention Time for One-Transistor Floating-Body RAM." Electron Devices, IEEE Transactions on, vol. 59, No. 8, 2012, pp. 2167-2172.

Aoulaiche, et al. "Hot hole induced damage in 1T-FBRAM on bulk FinFET." Reliability Physics Symposium (IRPS), 2011 IEEE International. IEEE, 2011, pp. 99-104.

Avci, et al. "Floating-Body Diode—A Novel DRAM Device." Electron Device Letters, IEEE, vol. 33, No. 2, 2012, pp. 161-163.

Bawedin, et al., "Floating-Body SOI Memory: Concepts, Physics, and Challenges", ECS Transactions 19.4 (2009), pp. 243-256.

Ban, et al. "Integration of Back-Gate doping for 15-nm node floating body cell (FBC) memory." VLSI Technology (VLSIT), 2010 Symposium on. IEEE, 2010, pp. 159-160.

Cho, et al. "Variation-aware study of BJT-based capacitorless DRAM cell scaling limit." Silicon Nanoelectronics Workshop (SNW), 2012 IEEE. IEEE, 2012, pp. 1-2.

Cho, et al. "Variation Study and Implications for BJT-Based Thin-Body Capacitorless DRAM." Electron Device Letters, IEEE, vol. 33, No. 3, 2012, pp. 312-314.

Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

(56) References Cited

OTHER PUBLICATIONS

Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "A survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p-and n-SOI MuGFETs with high-k gate dielectrics and TiN metal gate electrode for a 1T-DRAM application." SOI Conference (SOI, 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Kim, et al. Resistive-Memory Embedded Unified RAM (R-URAM, 2009, pp. 2670-2674.
Lu, et al., "A Floating-Body/Gate DRAM Cell Upgraded for Long Retention Time", IEEE Elec. Dev. Letters, vol. 32, No. 6, pp. 731-733, Jun. 2011.
Lu, et al., "A Simplified Superior Floating-Body/Gate DRAM Cell", IEEE Elec. Dev. Letters, vol. 30, No. 3, Mar. 2009, pp. 282-284.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982): 337-344.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Mahatme, et al. "Total ionizing dose effects on ultra thin buried oxide floating body memories." Reliability Physics Symposium (IRPS), 2012 IEEE International, 2012, pp. 1-5.
Moon, et al. "An optically assisted program method for capacitorless 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-6.
Moon, et al. "Fin-width dependence of BJT-based 1T-DRAM implemented on FinFET." Electron Device Letters, vol. 31, No. 9 (2010): 909-911.
Moon, et al. "Ultimately scaled 20nm unified-RAM." Electron Devices Meeting (IEDM), 2010 IEEE International. IEEE, 2010, pp. 12-2.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Pellizzer et al., A 90nm Phase Change Memory Technology for Stand-Alone Non-Volatile Memory Applications, pp. 1-1, 2006.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica et al. Scaled 1T-Bulk devices built with CMOS 90nm technology for low-cost eDRAM applications. Pascale. mazoyer©st.com, 2005, 38-39.
Reisch, "On bistable behavior and open-base breakdown of bipolar transistors in the avalanche regime-modeling and applications." Electron Devices, IEEE Transactions on 39.6 (1992): 1398-1409.

\* cited by examiner

Floating Body 24 is positively charged and V(BL 18) = 0.0V

FB is neutrally charged: and V(BL 18) = V(FB 24) = 0V

MEMORY DEVICE COMPRISING AN ELECTRICALLY FLOATING BODY TRANSISTOR

CROSS-REFERENCE

This application claims the benefit of U.S. Provisional Application No. 61/927,484, filed on Jan. 15, 2014, which application is hereby incorporated herein, in its entirety, by reference thereto.

FIELD OF THE INVENTION

The present invention relates to semiconductor memory technology. More specifically, the present invention relates to a semiconductor memory device comprising of an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), all of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), which are hereby incorporated herein, in their entireties, by reference thereto).

Widjaja and Or-Bach describe a bi-stable SRAM cell incorporating a floating body transistor, where more than one stable state exists for each memory cell (for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Patent Application Publication No. 2013/0264656 A113/746,523, "Memory Device Having Electrically Floating Body Transistor" ("Widjaja-3"), all of which are hereby incorporated herein, in their entireties, by reference thereto). This is bi-stability is achieved due to the applied back bias which causes impact ionization and generates holes to compensate for the charge leakage current and recombination.

SUMMARY OF THE INVENTION

According to an aspect of the present invention, a bi-stable SRAM cell is provided that incorporates a floating body transistor in SOI substrate.

In another aspect of the present invention, a memory cell includes: a silicon-on-insulator (SOI) substrate; an electrically floating body transistor fabricated on the silicon-on-insulator (SOI) substrate; and a charge injector region;

wherein the floating body transistor is configured to have more than one stable state through an application of a bias on the charge injector region.

In at least one embodiment, the floating body region comprises a first conductivity type selected from p-type conductivity type and n-type conductivity type, and the memory cell further includes: a source line region comprising a second conductivity type selected from the p-type conductivity type and the n-type conductivity type and being different from the first conductivity type, the source line region in physical contact with the floating body region; a drain region comprising the second conductivity type in physical contact with the floating body region and spaced apart from the source line region; and wherein the charge injection region comprises the second conductivity type and is in physical contact with the floating body region and spaced apart from the source line region and the drain line region.

In at least one embodiment, a memory array is provided that includes a plurality of the above-described memory cells arranged in at least one row and at least one column.

In at least one embodiment, the memory cell further includes a gate positioned in between the source line region and the drain region, above the floating body region.

In at least one embodiment, the memory cell is configured such that a holding operation on the memory cell does not require any interruption to access to the memory cell.

In at least one embodiment, the above-described array includes a charge injector terminal connected to all of the memory cells in a row or column of the array; wherein the charge injector terminal is configured to perform a holding operation on all of the memory cells connected to the charge injector terminal in a batch operation, so that no individual selection of one of the memory cells is required to perform the holding operation.

In at least one embodiment, application of a charge to the charge injector region in performance of a holding operation also increases a size of a memory window of the floating body region.

In at least one embodiment, the memory cell further includes a second charge injection region in contact with the floating body region and spaced apart from the first charge injection region.

In at least one embodiment, the charge injector region comprises a first charge injector region, the memory cell further comprising a second charge injector region, wherein the first and second charge injector regions are configured to maintain a state of the memory cell.

In at least one embodiment, a depth of at least one of the drain region, the source line region and the charge injector region is less than a depth of at least one other of the drain region, the source line region and the charge injector region.

In at least one embodiment, a depth of at least one of the drain region, the source line region and the charge injector region is equal to a depth of the floating body region, and a depth of at least one other of the drain region, the source line region and the charge injector region is less than the depth of the floating body region.

In at least one embodiment, the memory cell further includes a second gate region.

In at least one embodiment, the second gate region is positioned in between the charge injection region and one of the source line region and the drain region.

In at least one embodiment, a memory device is provided that includes a memory cell as described above connected in series to an access device.

In at least one embodiment, a memory device is provided that includes a memory cell as described above, connected in series to an access device; wherein the access device includes: a body region comprising the first conductivity type; a second source line region comprising the second conductivity type in contact with the body region; a second drain region comprising the second conductivity type in contact with the body region and spaced apart from the second source line region; and a body tap region comprising the first conductivity type in contact with the body region.

In at least one embodiment, the body tap region is configured to apply a bias on the body region.

In at least one embodiment, the memory cell and the access device comprise two transistors each having a same conductivity type.

In at least one embodiment, the memory cell and the access device comprise two transistors each having a different conductivity type.

In at least one embodiment, a memory device includes a memory cell as described above connected in series to an access device, wherein the access device includes: a body region comprising the first conductivity type; a second source line region comprising the second conductivity type in contact with the body region; and a second drain region comprising the second conductivity type in contact with the body region and spaced apart from the second source line region.

In another aspect of the present invention, a content addressable memory cell includes: a memory cell as described above, wherein the memory cell includes a first floating body transistor and a second floating body transistor; wherein the first floating body transistor and the second floating body transistor are electrically connected in series through a common node; and wherein the first floating body transistor and the second floating body transistor store complementary data.

In at least one embodiment, the content addressable memory cell is configured as a ternary content addressable memory cell.

In another aspect of the present invention, a memory cell includes: a memory device; and an access device connected in series to the memory device; wherein the memory device is configured to store a state of the memory cell, and the access device is configured to access the memory device.

In at least one embodiment, the memory device includes: a floating body region comprising a first conductivity type selected from p-type conductivity type and n-type conductivity type: a first source line region comprising a second conductivity type selected from the p-type conductivity type and the n-type conductivity type and being different from the first conductivity type, the first source line region in contact with the floating body region; a first drain region comprising the second conductivity type in physical contact with the floating body region and spaced apart from the first source line region; and a charge injection region comprising the second conductivity type, contacting the floating body region and spaced apart from the first source line region and the first drain line region; and the access device includes: a body region comprising the first conductivity type; a second source line region comprising the second conductivity type in contact with the body region; and a second drain region comprising the second conductivity type in contact with the body region and spaced apart from the second source line region.

In at least one embodiment, the memory cell further includes a conductive element connecting the first source line region to the second source line region.

In at least one embodiment, the access device further includes a body tap region comprising the first conductivity type in contact with the body region.

In another aspect of the present invention, a method of performing an operation on a memory cell is provided, including: providing the memory cell including: a substrate; an electrically floating body transistor; a source line region; a drain region; a charge injector region; and a gate positioned in between the source line region and the drain region, above the floating body region; and imposing bias conditions on the substrate, source line region, drain region, charge injector region and gate to perform the operation.

In at least one embodiment, the operation includes a holding operation, and the bias conditions imposed include: applying a positive bias to the charge injector region;

applying zero or low negative bias to the gate; applying zero bias to the source line region; applying zero bias to the drain region; and applying zero bias to the substrate.

In at least one embodiment, the operation includes a read operation, and the bias conditions imposed include: applying zero bias or a positive bias to the charge injector region; applying a positive bias to the gate; applying zero bias to the source line region; applying a positive bias to the drain region; and applying zero bias to the substrate.

In at least one embodiment, the positive bias applied to the drain region is less than the positive bias applied to the gate.

In at least one embodiment, the positive bias applied to the drain region is greater than or equal to the positive bias applied to the gate.

In at least one embodiment, the operation includes a write logic-1 operation, and the bias conditions imposed include: applying a positive bias to the charge injector region; applying a positive bias to the gate; applying zero bias to the source line region; applying a positive bias to the drain region; and applying zero bias to the substrate.

In at least one embodiment, the positive bias applied to the drain region is greater than or equal to the positive bias applied to the gate and generates a sufficiently high electric field to trigger an impact ionization mechanism.

In at least one embodiment, the operation includes a write logic-1 operation, and the bias conditions imposed include: applying a positive bias to the charge injector region; applying a negative bias to the gate; applying zero bias to the source line region; applying a positive bias to the drain region; and applying zero bias to the substrate.

In at least one embodiment, the operation includes a write logic-0 operation, and the bias conditions imposed include: applying zero bias or a positive bias to the charge injector region; applying zero bias to the gate; applying a negative bias to the source line region; applying zero bias to the drain region; and applying zero bias to the substrate.

In at least one embodiment, the operation includes a bit selective, write logic-0 operation, and the bias conditions imposed include: applying zero bias or a positive bias to the charge injector region; applying a positive bias to the gate; applying zero bias to the source line region; applying a negative bias to the drain region; and applying zero bias to the substrate.

In at least one embodiment, the positive bias applied to the gate is configured to increase a potential of the floating body by half of a potential corresponding to state logic-1, and the negative bias applied to the drain region comprises a negative voltage of half of the potential corresponding to state logic-1.

These and other features of the present invention will become apparent to those persons skilled in the art upon reading the details of the memory cells, memory devices, arrays and methods as more fully described below.

DETAILED DESCRIPTION OF THE INVENTION

Before the present memory cells, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a memory cell" includes a plurality of such memory cells and reference to "the array" includes reference to one or more arrays and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1:
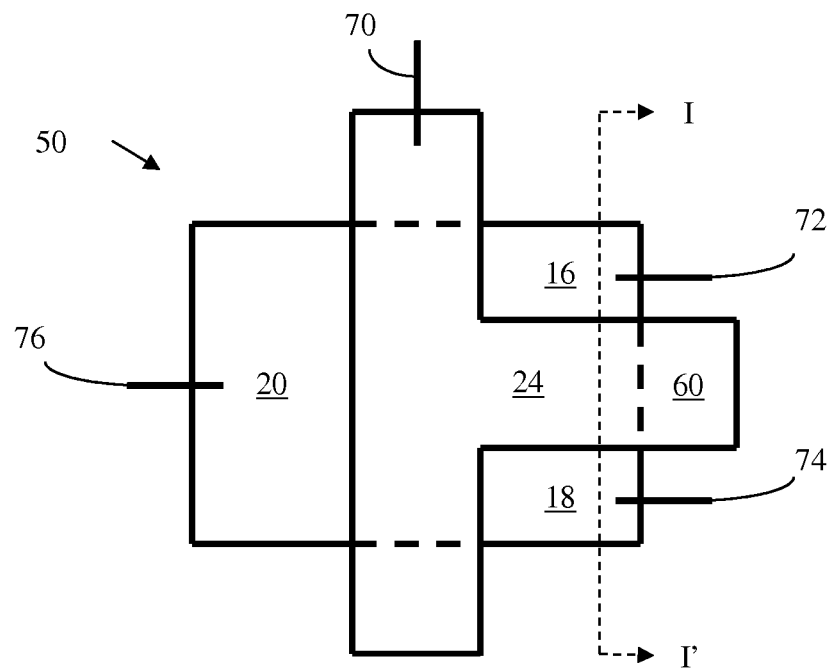
FIG. 1 is a schematic top view illustration of a memory cell according to an embodiment of the present invention.
Figure 2:
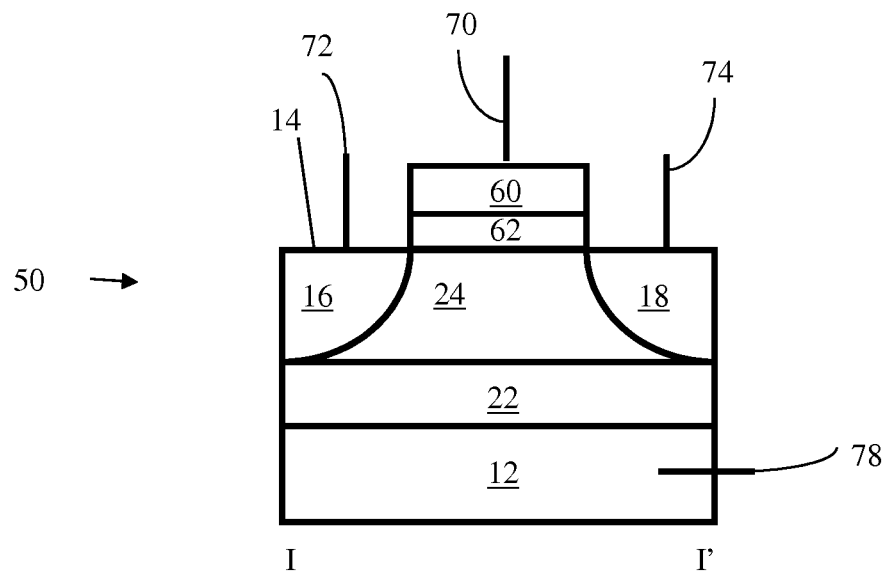
FIG. 2 is a schematic, cross-sectional illustration of the memory cell of FIG. 1, taken along line I-I'.

FIG. 1 illustrates a schematic top view of a memory device 50 according to an embodiment of the present invention, while FIG. 2 illustrates a schematic cross-sectional view of the memory device 50 along the cross-section line I-I'.

Memory cell 50 is fabricated on silicon-on-insulator (SOI) or germanium-on-insulator (GOI) or silicon-germanium-on-insulator (SiGeOI) or strained silicon-on-insulator (sSOI), strained germanium-on-insulator (sGOI), or strained silicon-germanium-on-insulator (sSiGeOI) substrate, which comprises buried insulator layer 22, which may be buried oxide (BOX). Substrate 12 is typically made of silicon, but may also comprise, for example, amorphous or polycrystalline silicon, strained silicon, germanium, silicon germanium, gallium arsenide, carbon nanotubes, or other semiconductor materials.

Memory cell 50 further comprises a floating body region 24 of a first conductivity type, such as p-type conductivity for example (but alternatively may be n-type conductivity), bounded on top by surface 14 and insulating layer 62, on the sides by source line region 16 of a second conductivity type, such as n-type conductivity for example (but, alternatively, may be p-type conductivity when floating body region 24 is n-type conductivity), drain region 18 of the second conductivity type (but, like source line region 16, may be p-type conductivity when floating body region is n-type conductivity), and at the bottom by buried insulator layer 22. Memory cell 50 may store charge in the floating body region 24, which indicates the states of the memory cell 50.

Source line region 16 and drain region 18 may be formed by an implantation process on the material making up substrate 12, according to any implantation process known and typically used in the art. Alternatively, a solid state diffusion or a selective epitaxial growth process could be used to form source line region 16 and drain region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory cell 50 also comprises charge injector region 20 (see FIG. 1) of the second conductivity type, such as n-type for example (or, alternatively, p-type, when floating body region is n-type).

Cell 50 includes several terminals: word line (WL) terminal 70 electrically connected to gate 60, bit line (BL) terminal 74 electrically connected to drain region 18, source line (SL) terminal 72 electrically connected to source line region 16, charge injector (CI) terminal 76 electrically connected to charge injector region 20, and substrate (SUB) terminal 78 electrically connected to the substrate 12. Alternatively, the SL terminal 72 may be electrically connected to drain region 18 and BL terminal 74 may be electrically connected to source line region 16.

Figure 3:
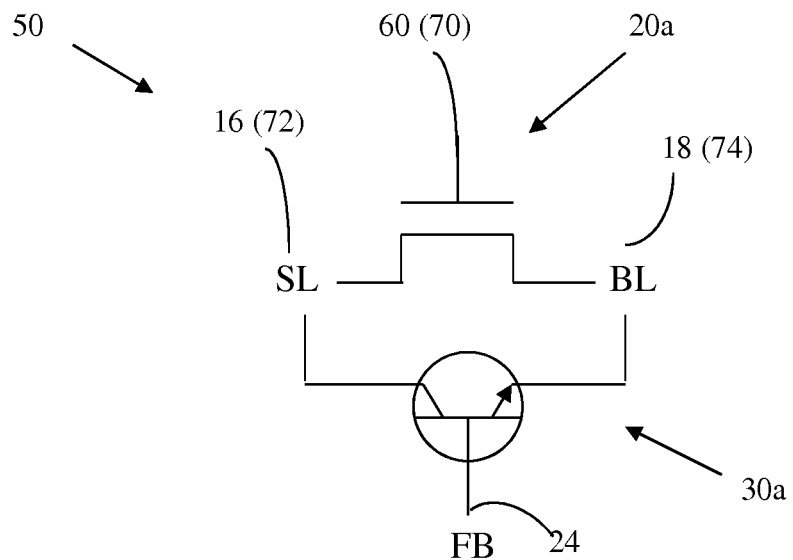
FIG. 3 schematically illustrates an equivalent circuit representation of the memory cell shown in FIGS. 1-2, according to an embodiment of the present invention.
Figure 4:
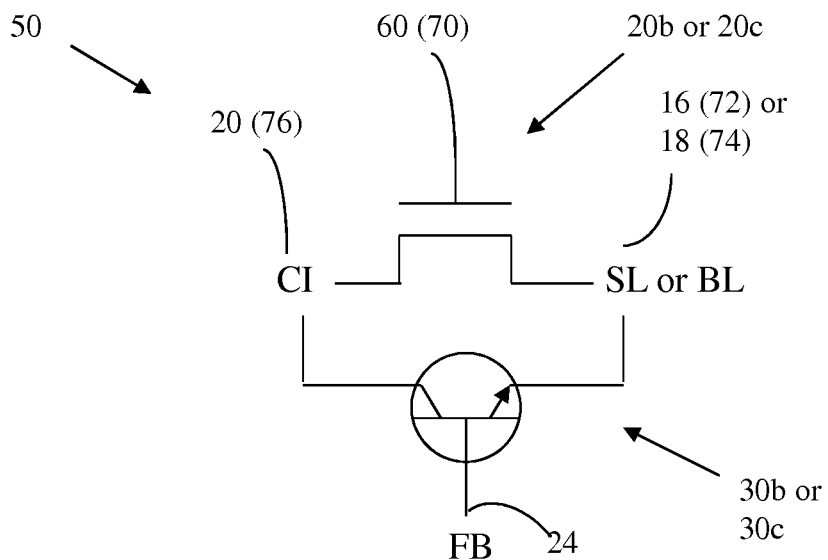
FIG. 4 schematically illustrates another equivalent circuit representation of the memory cell shown in FIGS. 1-2, according to an embodiment of the present invention.

As illustrated in FIG. 3, inherent in cell 50 is metal-oxide-semiconductor (MOS) transistor 20a formed by source line region 16, gate 60, drain region 18, and floating body region 24. In addition, bipolar transistor 30a formed by source line region 16, floating body region 24, and drain region 18 is also inherent in cell 50. Similarly, MOS transistors 20b and 20c, formed by charge injector region 20, gate 60, source line region 16 or drain region 18, and floating body region 24; and bipolar transistors 30b and 30c, formed by charge injector region 20, floating body region 24, and source line region 16 or drain region 18; are inherent in cell 50, as shown in FIG. 4.

During the operation of memory cell 50, at least one of the MOS transistors 20b or 20c is used to maintain the state stored in memory cell 50, while the other of MOS transistors 20a used for other operations, such as read and write operations. At least one of the bipolar transistors 30b or 30c may also be used to maintain the charge stored in the floating body region 24, while the other bipolar transistor 30a is used for other memory cell operations, such as read and write operations.

Figure 5A:
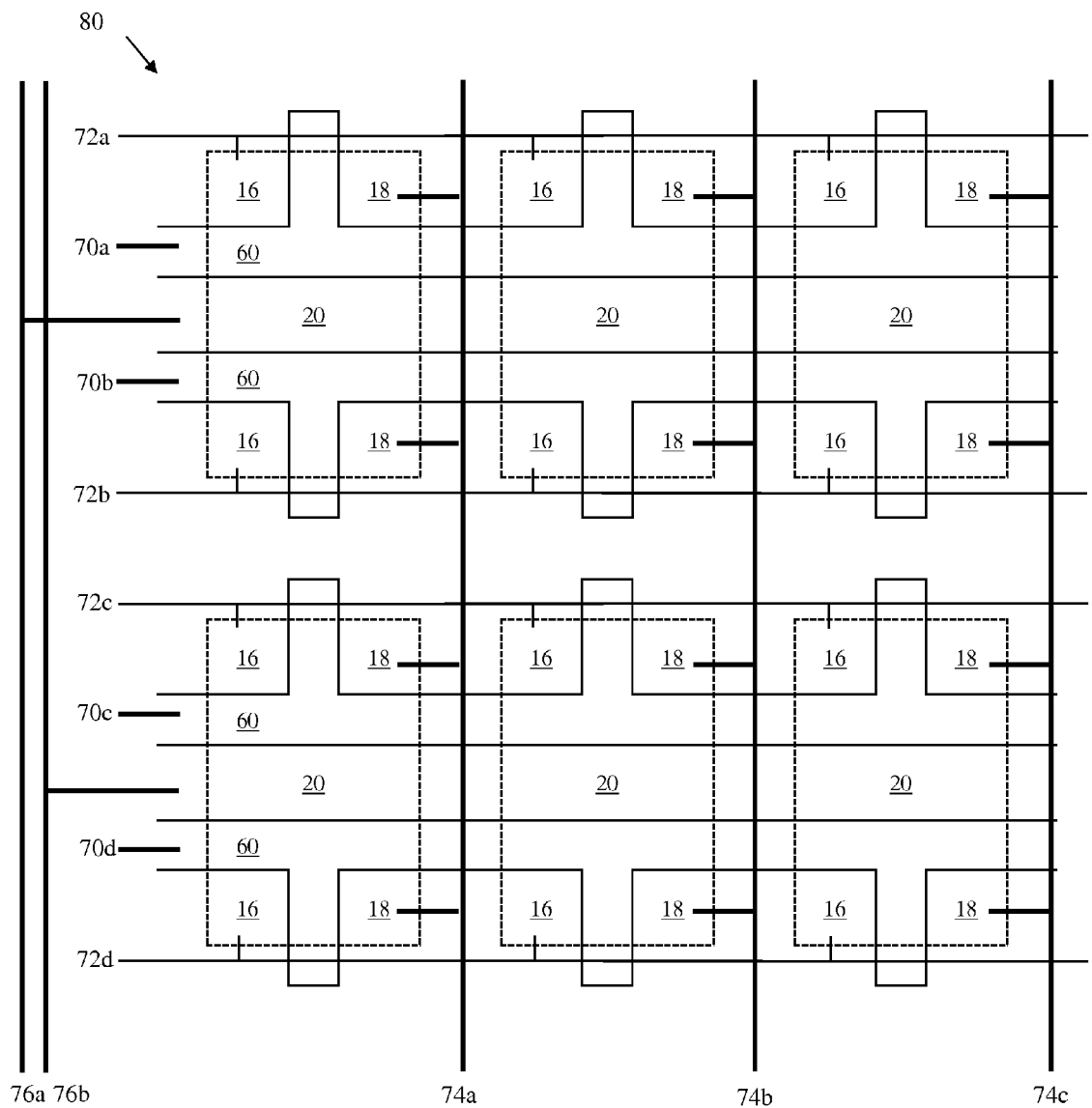
FIG. 5A schematically illustrates multiple cells of the type illustrated in FIGS. 1-2 joined in an array according to an embodiment of the present invention.
Figure 5B:
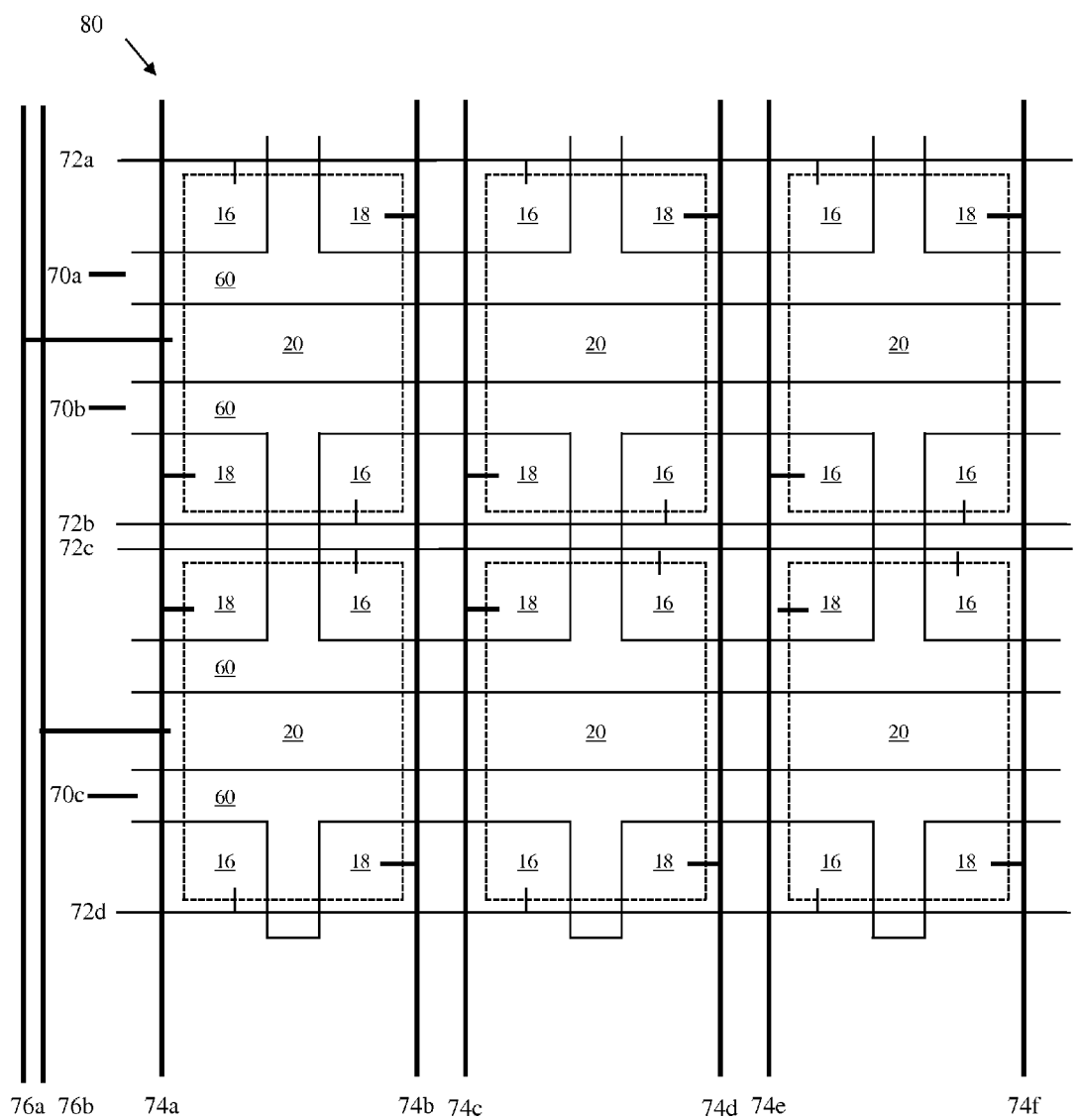
FIG. 5B schematically illustrates multiple cells of the type illustrated in FIGS. 1-2 joined in an array according to another embodiment of the present invention.

FIGS. 5A and 5B illustrate a plurality of memory cells 50 arranged in rows and columns to form a memory array 80 according to two embodiments of the present invention. Word line (WL) terminal 70 (70a, 70b, 70c and 70d as shown, but may be more or fewer WL terminals 70, depending upon the configuration of array 80) electrically connected to gates 60 of a row of cells 50, bit line (BL) terminal 74 (74a, 74b, 74c, as shown, by may be more or fewer BL terminals 74, depending upon the configuration of array 80) is electrically connected to drain regions 18 of a column of cells 50, source line (SL) terminal 72 (72a, 72b, 72c and 72d as shown, but may be more or fewer SL terminals 72, depending upon the configuration of array 80) is electrically connected to source line regions 16 of a row of cells 50, charge injector terminal (CI) 76 (76a and 76b as shown, but may be more or fewer or common depending upon the configuration of array 80) electrically connected to charge injector region 20, and substrate terminal 78 electrically connected to the substrate 12 (not shown in FIGS. 5A-5B). Alternatively, the SL terminal 72 may be electrically connected to drain regions 18 and BL terminal 74 may be electrically connected to source line regions 16. A CI terminal 76 may be electrically connected to a row of charge injector regions 20 (where the charge injector regions 20 may be common for two rows of cells 50 as shown in FIGS. 5A and 5B). A plurality of rows (two, or greater than two) of charge injector regions 20 may also be connected in common to a CI terminal 76, depending upon the configuration of array 80.

Figure 6:
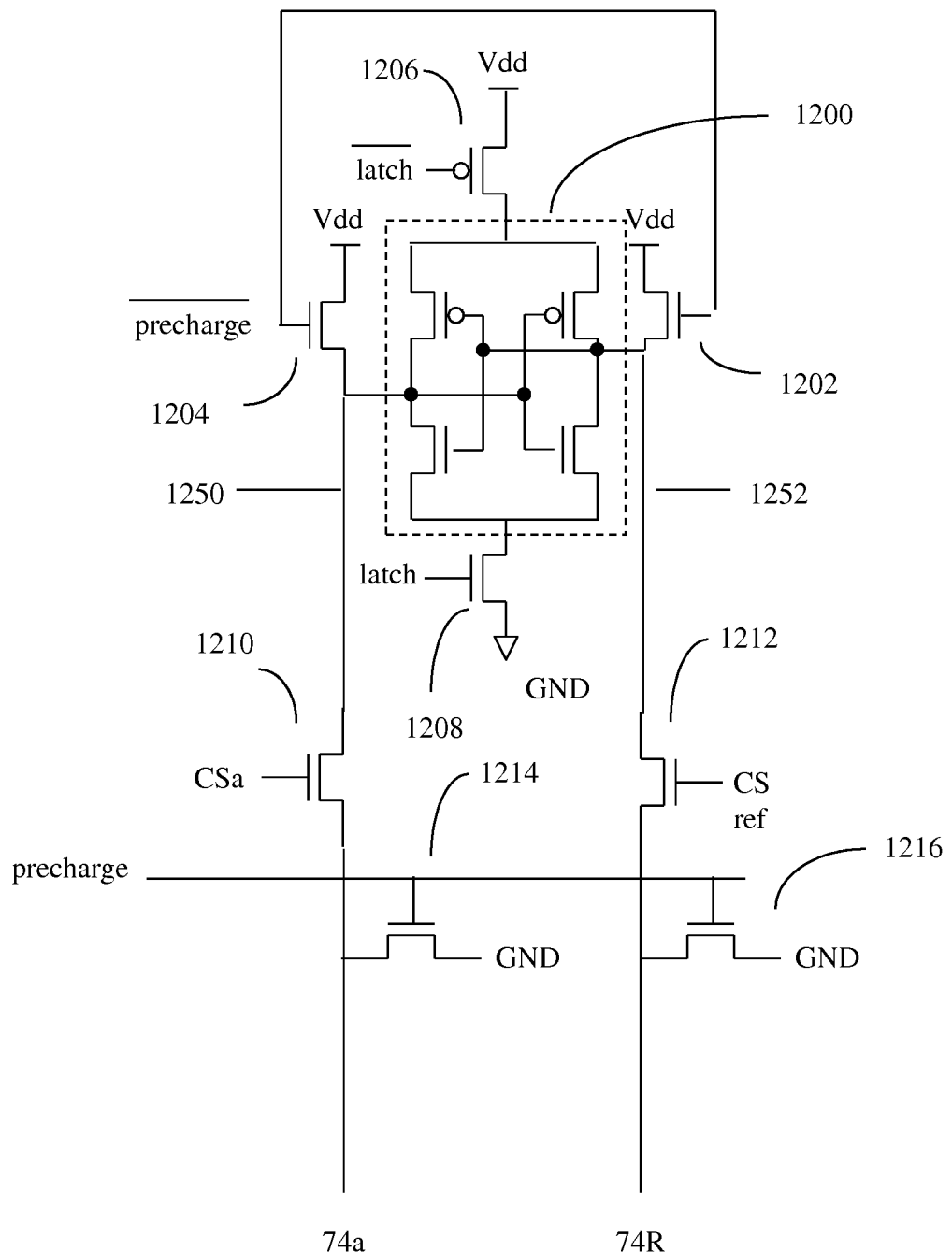
FIG. 6 shows an exemplary sensing circuit connected to a selected memory cell during a read operation according to an embodiment of the present invention.

The BL terminal 74 may be connected to a sensing circuit, which senses the state of a selected memory cell 50, as shown in FIG. 6. The cell current of the selected memory cell 50 may be compared to that of a reference cell connected to the reference BL 74R. The difference between the cell current of the memory cell 50 and the reference cell is amplified by the latch 1200. The results of the sensing circuit will be reflected in nodes 1250 and 1252, where node 1252 will be at Vdd if the selected memory cell 50 is in logic-1 state and will be at GND if the selected memory cell 50 is in logic-0 state. Examples of reference cells have been described for example in U.S. patent application Ser. No. 13/244,899, "Asymmetric Semiconductor Memory Device Having Electrically Floating Body Transistor", U.S. patent application Ser. No. 14/328,633, "Systems and Methods for Reducing Standby Power in Floating Body Memory Devices", and "A 128 Mb Floating Body RAM (FBRAM) on SOI with Multi-Averaging Scheme of Dummy Cell", T. Ohsawa, et al., Digest of Technical Papers, Symposium on VLSI Circuits, 2006, which are hereby incorporated herein, in their entireties, by reference thereto.

When no reading operation is performed, the precharge signal is high, which will turn off transistors 1202 and 1204 and turn on transistors 1214 and 1216, bringing the BL terminals 74a and 74R to GND. The latch 1200 is also turned off when no reading operation is performed by turning off transistors 1206 and 1208. During a read operation, the precharge signal switches to low, enabling transistors 1202 and 1204, while turning off the transistors 1214 and 1216. Subsequently, the selected memory cell BL and reference memory cell BL (through column select CS transistors 1210 and 1212) are enabled. If memory cell 50a is in logic-1 state, it will pull node 1250 to a lower voltage than node 1252 and vice versa. The latch signal is subsequently turned on, amplifying the difference between nodes 1250 and 1252 to Vdd and GND through latch 1200.

Several operations can be performed to memory cell 50, such as: holding, read, write logic-1 and write logic-0 operations.

Figure 7:
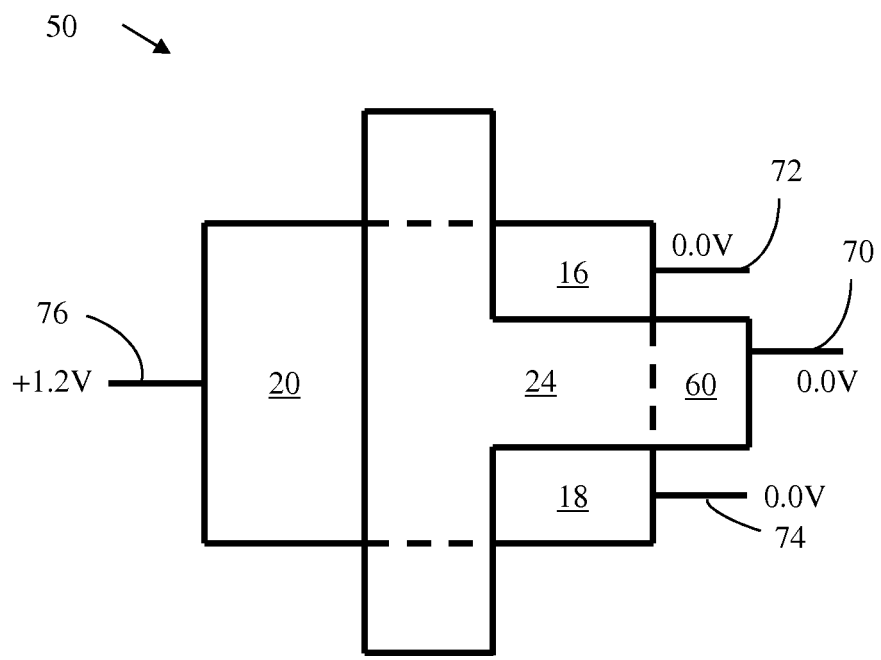
FIG. 7 illustrates bias conditions applied on the terminals of a memory cell to perform a holding operation, according to an embodiment of the present invention.

FIG. 7 illustrates a holding operation being performed on a selected memory cell 50 according to an embodiment of the present invention. The holding operation is performed by applying a positive bias to the CI terminal 76, zero or low negative bias on the WL terminal 70 to turn-off the channel region between the source line region 16 and the bit line region 18 of the memory cell 50, and zero bias on the SL terminal 74, SUB terminal 78 (not shown in FIG. 7), and BL terminal 74. The positive bias applied to the charge injector region 20 connected to the CI terminal 76 will maintain the state of the memory cell 50 that it is connected to by maintaining the charge stored in the floating body region 24. The positive bias applied to the CI terminal 76 needs to generate an electric field sufficient to trigger an impact ionization mechanism when the floating body region 24 is positively charged, as will be described through the band diagram shown in FIGS. 8A and 8B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 50 are: 0 volts is applied to WL terminal 70, 0 volts is applied to BL terminal 74, 0 volts is applied to SL terminal 72, a positive voltage, for example, +1.2 volts is applied to CI terminal 76, and 0 volts is applied to the substrate terminal 78. In other embodiments, different voltages may be applied to the various terminals of memory cell 50 and the exemplary voltages described are not limiting.

Figure 8A:
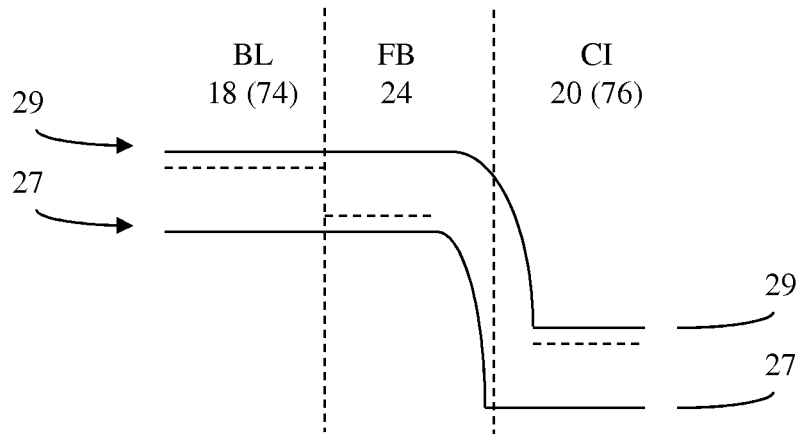
FIG. 8A shows an energy band diagram characterizing an intrinsic n-p-n bipolar device when a floating body region is positively charged and a positive bias voltage is applied to a charge injector region of a memory cell according to an embodiment of the present invention.

FIG. 8A shows an energy band diagram characterizing the intrinsic n-p-n bipolar device 30b (or 30c) when the floating body region 24 is positively charged and a positive bias voltage is applied to the charge injector region 20. The vertical dashed lines mark the different regions of the bipolar device 30b. The energy band diagram of the intrinsic n-p-n bipolar device 30c can be constructed in a similar manner, with the source line region 16 (connected to the SL terminal 72) in place of the bit line region 18 (connected to the BL terminal 74). The horizontal dashed lines indicate the Fermi levels in the various regions of the n-p-n transistor 30b. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic "1", the bipolar transistors 30b and 30c will be turned on as the positive charge in the floating body region lowers the energy bather of electron flow (from the source line region 16 or bit line region 18) into the base region (floating body region 24). Once injected into the floating body region 24, the electrons will be swept into the charge injector region 20 (connected to CI terminal 76) due to the positive bias applied to the charge injector region 22. As a result of the positive bias, the electrons are accelerated and create additional hot carriers (hot hole and hot electron pairs) through an impact ionization mechanism. The resulting hot electrons flow into the CI terminal 76 while the resulting hot holes will subsequently flow into the floating body region 24. When the following condition is met: $\beta \times (M-1) \approx 1$—where $\beta$ is the forward common-emitter current gain of the bipolar transistors 30b or 30c and M is the impact ionization coefficient—the amount of holes injected into the floating body region 24 compensates for the charge lost due to p-n junction forward bias current between the floating body region 24 and the source line region 16 or bit line region 18 and due to holes recombination. This process maintains the charge (i.e. holes) stored in the floating body region 24 which will keep the n-p-n bipolar transistors 30b and 30c on for as long as a positive bias is applied to the charge injector region 20 through CI terminal 76.

The region where the product $\beta \times (M-1)$ approaches 1 and is characterized by hole current moving into the base region of a bipolar transistor is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), and "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 ("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 50, the state of the memory cell is maintained due to the bipolar transistors 30b and 30c, while the remaining cell operations (i.e. read and write operations) are governed by the lateral bipolar transistor 30a and MOS transistor 20a. Hence, the holding operation does not require any interruptions to the memory cell 50 access.

If floating body 24 is neutrally charged (the voltage on floating body 24 being equal to the voltage on grounded bit line region 18), a state corresponding to logic-0, no (or low) current will flow through the n-p-n bipolar devices 30b and 30c. The bipolar devices 30b and 30c will remain off and no impact ionization occurs. Consequently memory cells in the logic-0 state will remain in the logic-0 state.

Figure 8B:
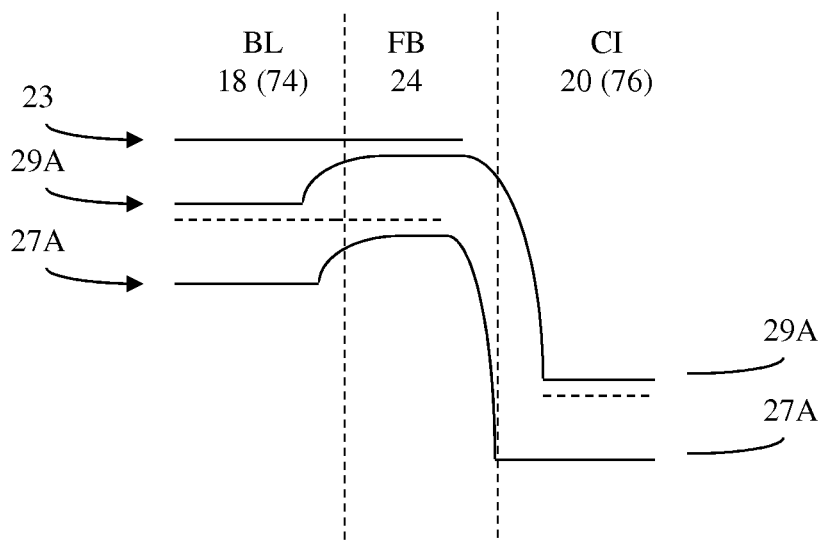
FIG. 8B shows an energy band diagram of an intrinsic n-p-n bipolar device when a floating body region is neutrally charged and a bias voltage is applied to a charge injector region of a memory cell according to an embodiment of the present invention.

FIG. 8B shows an energy band diagram of the intrinsic bipolar device 30b (or 30c) when the floating body region 24 is neutrally charged and a positive bias voltage is applied to the charge injector region 20. In this state the energy level of the band gap bounded by solid lines 27A and 29A is different in the various regions of n-p-n bipolar device 30b. Because the potentials of the floating body region 24 and the bit line region 18 are equal, the Fermi levels are constant, resulting in an energy barrier between the bit line region 18 and the floating body region 24. Solid line 23 indicates, for reference purposes, the energy barrier between the bit line region 18 and the floating body region 24. The energy bather prevents electron flow from the bit line region 18 (connected to BL terminal 74) to the floating body region 24. Thus the n-p-n bipolar device 30b and 30c will remain off.

Sakui-1 and Sakui-2 describe a memory cell based on the reverse base current effect, where the base of a n-p-n bipolar transistor is connected to a p-type MOS transistor. Reisch describes the challenges with the memory cell described in Sakui-1 and Sakui-2, which include the requirement for the current of the p-type MOS transistor. Because the collector terminal of the bipolar transistor also serves as the channel of the p-type MOS transistor, any changes in operating conditions or process conditions will affect both the bipolar transistor and the p-type MOS transistor. For example, increasing the doping level of the collector region will improve the impact ionization efficiency. However, it will also increase the doping level of the p-type MOS transistor channel region, and reduce the drive current of the p-type MOS transistor.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 and "Data Storage Device and Refreshing Method for Use with Such Device", Fazan et al. ("Fazan"), which are hereby incorporated herein, in their entireties, by reference thereto. Ohsawa and Fazan teach an autonomous refresh method by applying periodic gate and drain voltage pulses, which interrupt access to the memory cells being refreshed. In memory cell 50, more than one stable state is achieved because of the bipolar transistors 30b and 30c. The read and write operations of the memory cell 50 are governed by the lateral bipolar transistor 30a and MOS transistor 20a. Hence, the holding operation does not require any interruptions to the memory cell 50 access.

In the holding operation described with regard to FIG. 7, there is no individually selected memory cell. Rather the holding operation will be performed at all cells connected to the same CI terminal 76. In addition, the holding operation does not interrupt read or write access to the memory cell 50.

Figure 9:
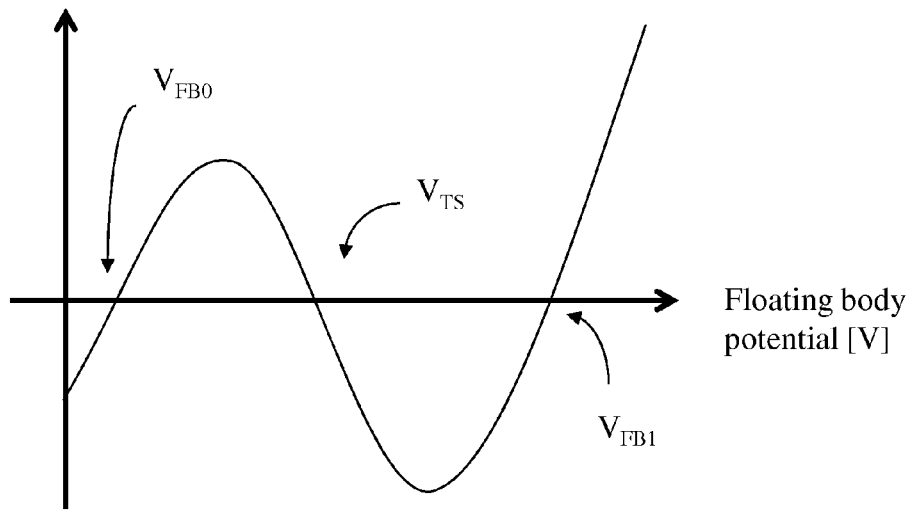
FIG. 9 shows a graph of the net current I flowing into or out of a floating body region as a function of the potential V of the floating body, according to an embodiment of the present invention.

FIG. 9 shows a graph of the net current (I) flowing into or out of the floating body region 24 as a function of the potential (V) of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 9, the net current is flowing into the floating body region 24 as a result of the p-n diode formed by the floating body region 24 and the charge injector region 20 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the charge injector region 20, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 30b and 30c.

Figure 10:
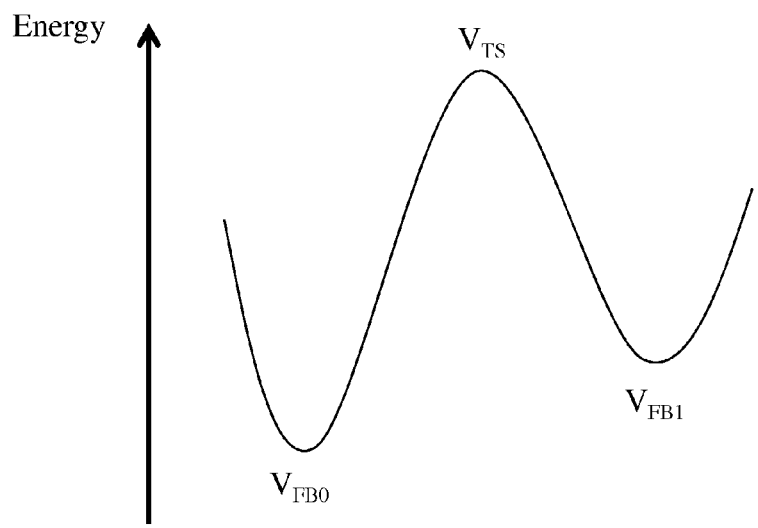
FIG. 10 shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 10 shows a schematic curve of a potential energy surface (PES) of the memory cell 50, which shows another representation of the two stable states resulting from applying a back bias to the CI terminal 76 (connected to the charge injector region 20). The values of the floating body 24 potential where the current changes direction, i.e. $V_{FB0}$, $V_{FB1}$, and $V_{TS}$, can be modulated by the potential applied to the CI terminal 76.

Figure 11:
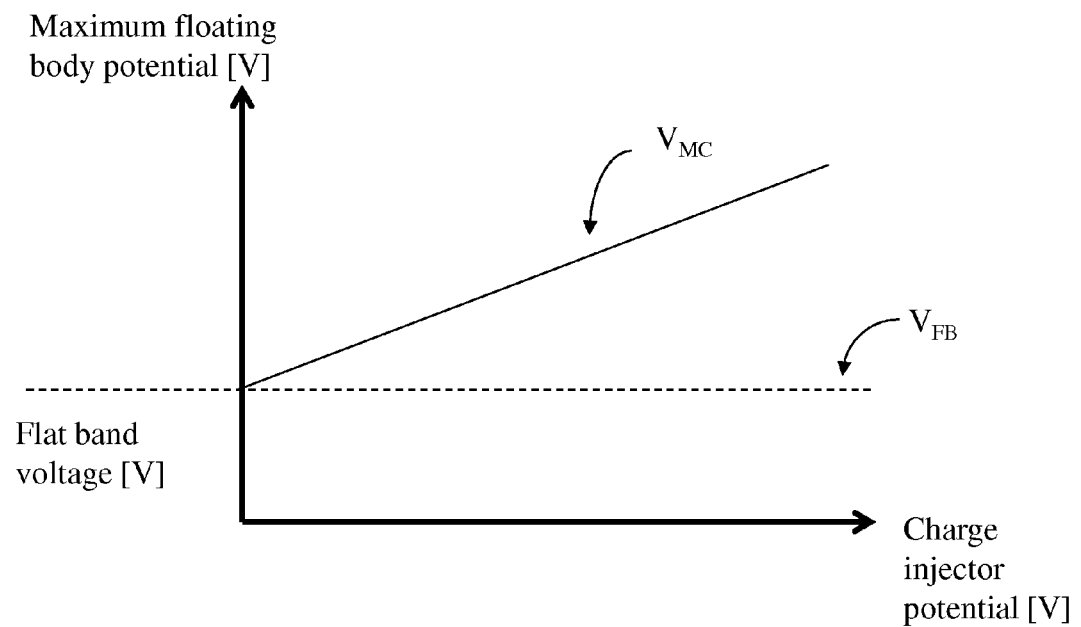
FIG. 11 illustrates a charge stored in a floating body region of a memory cell as a function of a potential applied to a charge injector region, connected to a charge injector (CI) terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to CI terminal 76, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the CI terminal 76 as shown in FIG. 11. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes that intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

Figure 12:
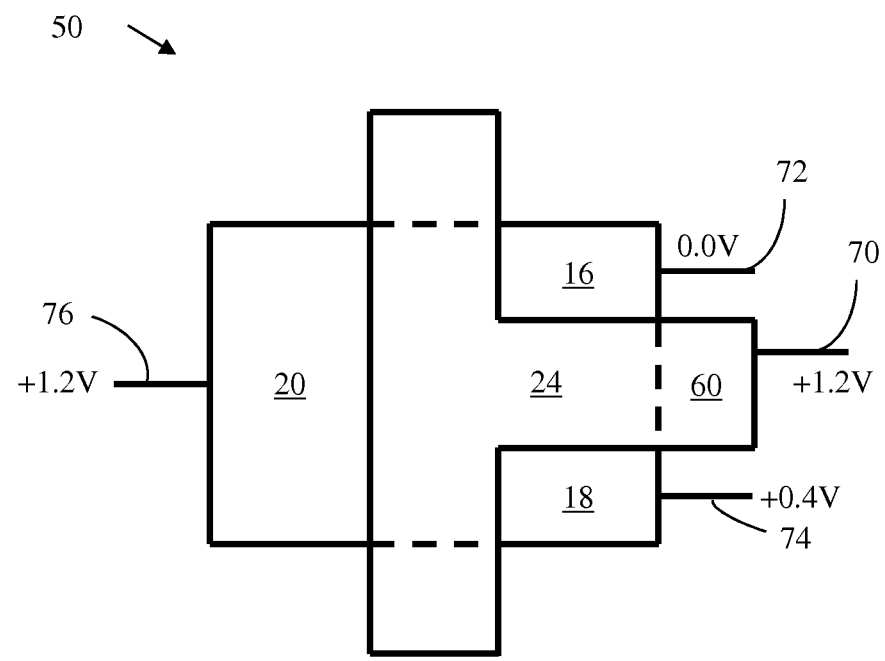
FIG. 12 illustrates bias conditions applied on the terminals of a memory cell to perform a read operation, according to an embodiment of the present invention.

FIG. 12 is a schematic view of a memory cell 50 showing exemplary bias conditions for performing a read operation on the memory cell 50, according to an embodiment of the present invention. The read operation can be performed by applying the following bias conditions: a positive bias to the WL terminal 70, a positive bias to the BL terminal 74, zero bias to the SL terminal 72, zero or positive bias to the CI terminal 76, and zero bias to the substrate terminal 78 (not shown in FIG. 12). All unselected WL terminals 70 (not shown) have zero or negative bias applied, all unselected BL terminals 74 (not shown) have zero volts applied, all unselected SL terminals 72 (not shown) have zero volts applied, all unselected CI terminals 76 (not shown) have zero or positive bias applied.

In one embodiment the bias conditions for the read operation for memory cell 50 are: +1.2 volts is applied to WL terminal 70, +0.4 volts is applied to BL terminal 74, 0.0 volts is applied to SL terminal 72, +1.2 volts is applied to CI terminal 76, and 0.0 volts is applied to the substrate terminal 78. In other embodiments, different voltages may be applied to the various terminals of memory cell 50 and the exemplary voltages described are not limiting. The positive voltage applied to BL terminal 74 may be less than the positive voltage applied to WL terminal 70, in which the difference in the threshold voltage of the memory cell 50 is employed to represent the state of the memory cell 50. The positive voltage applied to BL terminal 74 may also be greater than or equal to the positive voltage applied to WL terminal 70 and may generate sufficiently high electric field to trigger the bipolar read mechanism.

A sensing circuit typically connected to BL terminal 74 can be used to determine the data state of the memory cell 50. Any sensing scheme known in the art can be used in conjunction with memory cell 50. For example, the sensing schemes disclosed in Ohsawa-1 and Ohsawa-2 are incorporated by reference herein in there entireties, and can be used to determine the state of the memory cell 50.

Figure 13:
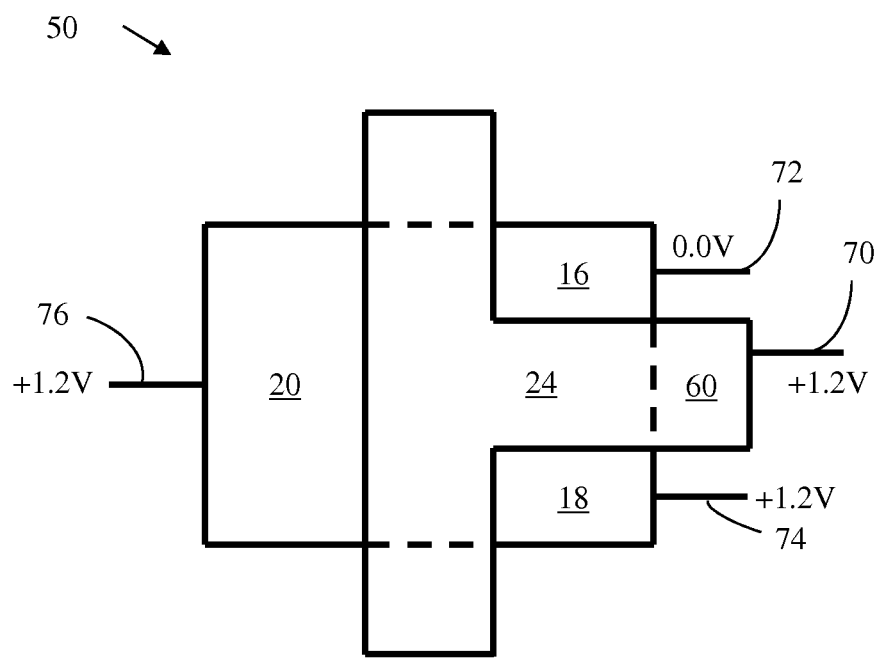
FIG. 13 illustrates bias conditions applied on the terminals of a memory cell to perform a write logic-1 operation using impact ionization mechanism, according to an embodiment of the present invention.

FIG. 13 is a schematic illustration of a memory cell 50 showing exemplary bias conditions for a write logic-1 operation on the memory cell 50 through an impact ionization mechanism, according to an embodiment of the present invention. The following bias conditions are applied: a positive voltage is applied to the selected WL terminal 70, a positive voltage is applied to the selected BL terminal 74, zero voltage is applied to the selected SL terminal 72, zero or positive voltage is applied to the selected CI terminal 76, and zero voltage is applied to the substrate terminal 78. This positive voltage applied to the selected BL terminal 74 is greater than or equal to the positive voltage applied to the selected WL terminal 70 and may generate sufficiently high electric field to trigger an impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, about 0.0 volts or +1.2 volts is applied to CI terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to unselected CI terminal 76. These voltage levels are exemplary only and may vary from embodiment to embodiment. Thus the exemplary embodiments, features, bias levels, etc., described are not limiting.

Figure 14:
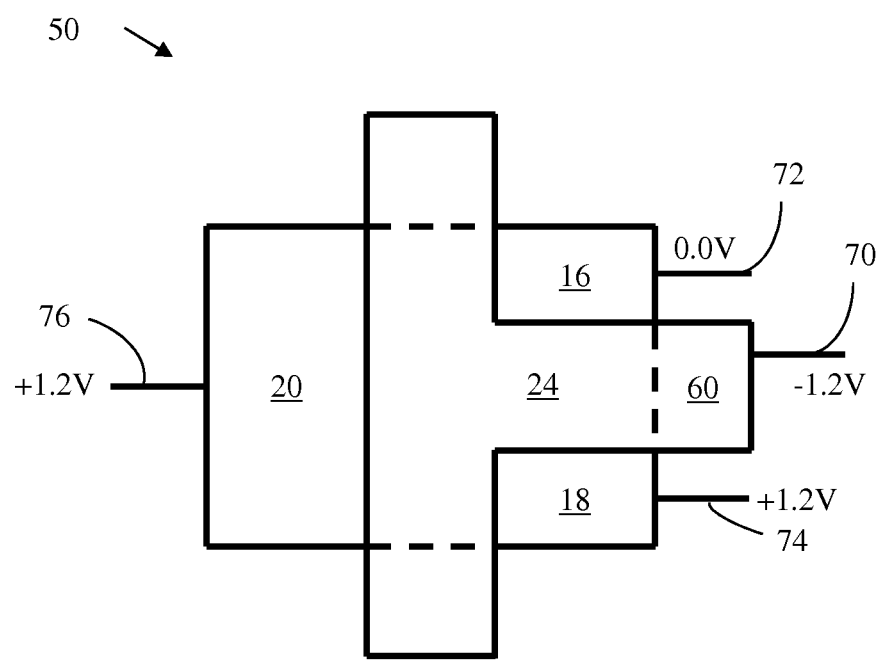
FIG. 14 illustrates bias conditions applied on the terminals of a memory cell to perform a write logic-1 operation using band-to-band tunneling mechanism, according to an embodiment of the present invention.

FIG. 14 is a schematic illustration showing bias conditions for a write logic-1 operation using band-to-band tunneling mechanism performed on memory cell 50 according to an embodiment of the present invention. A write logic-1 operation using band-to-band tunneling mechanism can be performed by applying the following bias conditions: a negative voltage is applied to the selected WL terminal 70, a positive voltage is applied to the selected BL terminal 74, zero voltage is applied to the selected SL terminal 72, zero or positive voltage is applied to the selected CI terminal 76, and zero voltage is applied to the substrate terminal 78.

In one particular non-limiting embodiment, about −1.2 volts is applied to the selected WL terminal 70, about +1.2 volts is applied to the selected BL terminal 74, about 0.0 volts is applied to SL terminal 72, about +1.2 volts is applied to CI terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to unselected CI terminal 76. These voltage levels are exemplary only may vary from embodiment to embodiment. Thus the exemplary embodiments, features, bias levels, etc., described are not limiting.

The negative bias on the gate 60 (connected to WL terminal 70) and the positive voltage on bit line region 18 (connected to BL terminal 74) create a strong electric field (for example, about $10^6$ V/cm in silicon, as described in Sze, p. 104) between the bit line region 18 and the floating body region 24 in the proximity of gate 60. This bends the energy band sharply upward near the gate and bit line junction overlap region, causing electrons to tunnel from the valence band of the floating body region 24 to the conduction band of the bit line region 18, leaving holes in the valence band. The electrons which tunnel across the energy band become the drain leakage current, while the holes are injected into floating body region 24 and become the hole charge that creates the logic-1 state.

Figure 15:
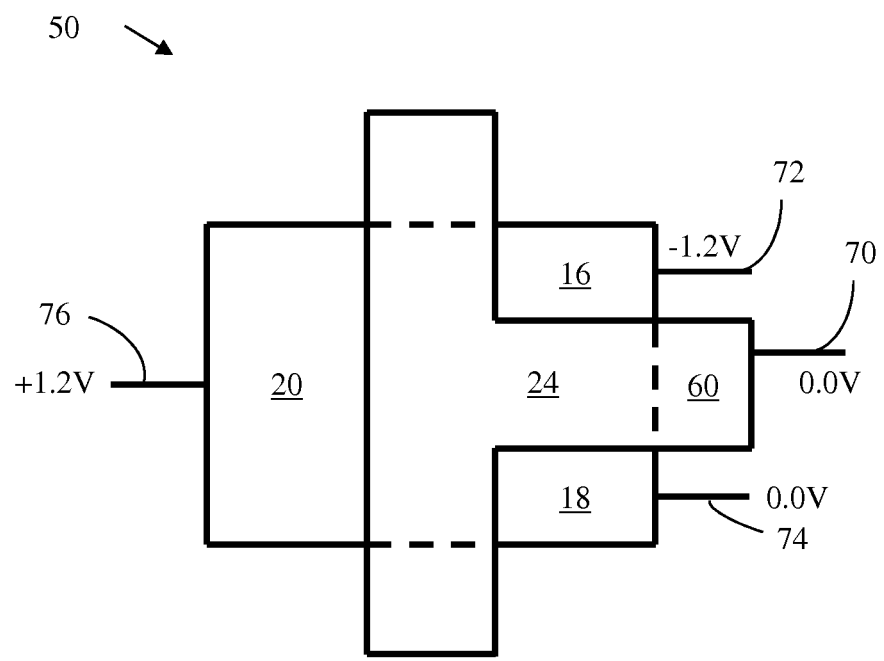
FIG. 15 illustrates bias conditions applied on the terminals of a memory cell to perform a write logic-0 operation, according to an embodiment of the present invention.

FIG. 15 is a schematic illustration showing bias conditions for a write logic-0 operation performed on memory cell 50 according to an embodiment of the present invention. A write logic-0 operation can be performed by applying a negative voltage bias to the selected SL terminal 72, a zero voltage bias to the WL terminal 70, zero voltage bias to the BL terminal 74, zero or positive voltage bias to the CI terminal 76, and zero voltage bias to the substrate terminal 78; while zero voltage is applied to the unselected SL terminals 72, zero voltage bias applied to the unselected WL terminals 70, zero or positive bias applied to the unselected CI terminal 76, and zero voltage bias applied to the substrate 78. Under these conditions, the p-n junction between floating body 24 and source line region 16 of the selected cell 50 is forward-biased, evacuating holes from the floating body 24. All memory cells 50 sharing the same selected SL terminal 72 will be written to simultaneously. To write arbitrary binary data to different memory cells 50, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72, about 0.0 volts is applied to selected WL terminal 70, about 0.0 volts is applied to selected BL terminal 74, about 0.0 volts or +1.2 volts is applied to selected CI terminal 76, and about 0.0 volts is applied to substrate terminal 78, while zero voltage is applied to the unselected SL terminals 72, zero voltage bias applied to the unselected WL terminals 70, zero or positive bias applied to the unselected CI terminal 76, and zero voltage bias applied to the substrate 78. These voltage levels are exemplary only may vary from embodiment to embodiment. Thus the exemplary embodiments, features, bias levels, etc., described are not limiting.

Figure 16:
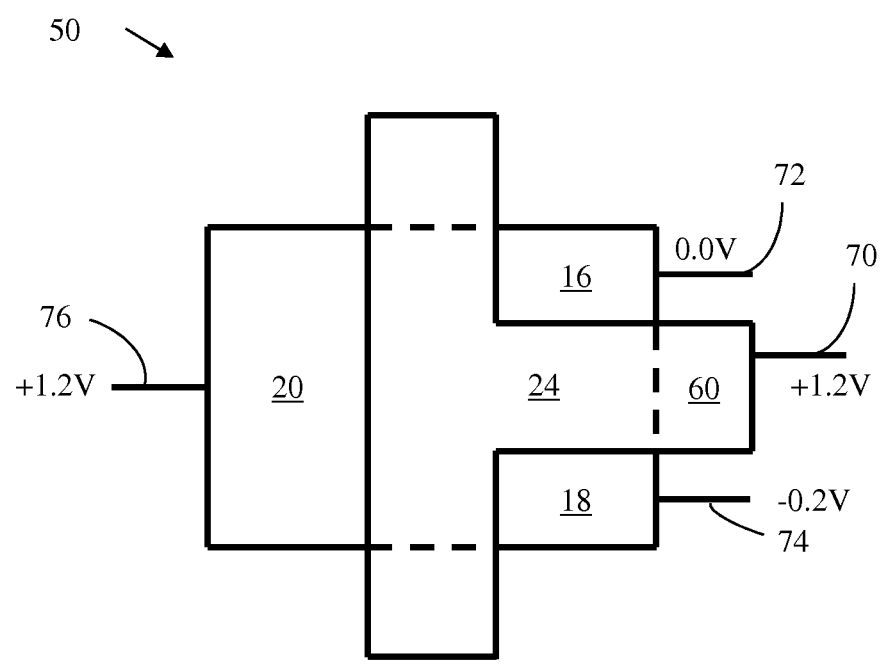
FIG. 16 illustrates bias conditions applied on the terminals of a memory cell to perform a write logic-0 operation according to another embodiment of the present invention.

FIG. 16 is a schematic illustration showing bias conditions applied for a bit-selective write logic-0 operation performed on memory cell 50 according to an embodiment of the present invention. The bit-selective write logic-0 operation may be performed by applying a positive voltage to the selected WL terminal 70, a negative voltage to the selected BL terminal 74, zero voltage bias to the selected SL terminal 72, zero or positive voltage bias to the selected CI terminal 76, and zero voltage to the substrate terminal 78; while zero voltage is applied to the unselected WL terminals 70, zero voltage is applied to the unselected BL terminals 74, zero voltage bias is applied to the unselected SL terminals 72, zero or positive voltage is applied to the unselected CI terminal 76, and zero voltage is applied to the substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body region 24 and bit line region 18 is forward-biased, evacuating holes from the floating body 24.

To reduce undesired write logic-0 disturb to other memory cells 50 in a memory array, the applied potential can be optimized as follows: if the floating body 24 potential of state logic-1 is referred to as $V_{FB1}$, then the voltage applied to the WL terminal 70 is configured to increase the floating body 24 potential by $V_{FB1}/2$ while $-V_{FB1}/2$ is applied to BL terminal 74. Additionally, either ground or a slightly positive voltage may also be applied to the BL terminals 74 of unselected memory cells 50 that do not share the same BL terminal 74 as the selected memory cell 50a, while a negative voltage may also be applied to the WL terminals 70 of unselected memory cells 50 that do not share the same WL terminal 70 as the selected memory cell 50.

As illustrated in FIG. 16, the following exemplary bias conditions may be applied to the selected memory cell 50 to perform a bit-selective write logic-0 operation: a potential of about −0.2 volts to the selected BL terminal 74, a potential of about +1.2 volts to the selected WL terminal 70, about 0.0 volts is applied to the selected SL terminal 72, a potential of about +1.2 volts to the selected CI terminal 76, about 0.0 volts to the substrate terminal 78.

Figure 17:
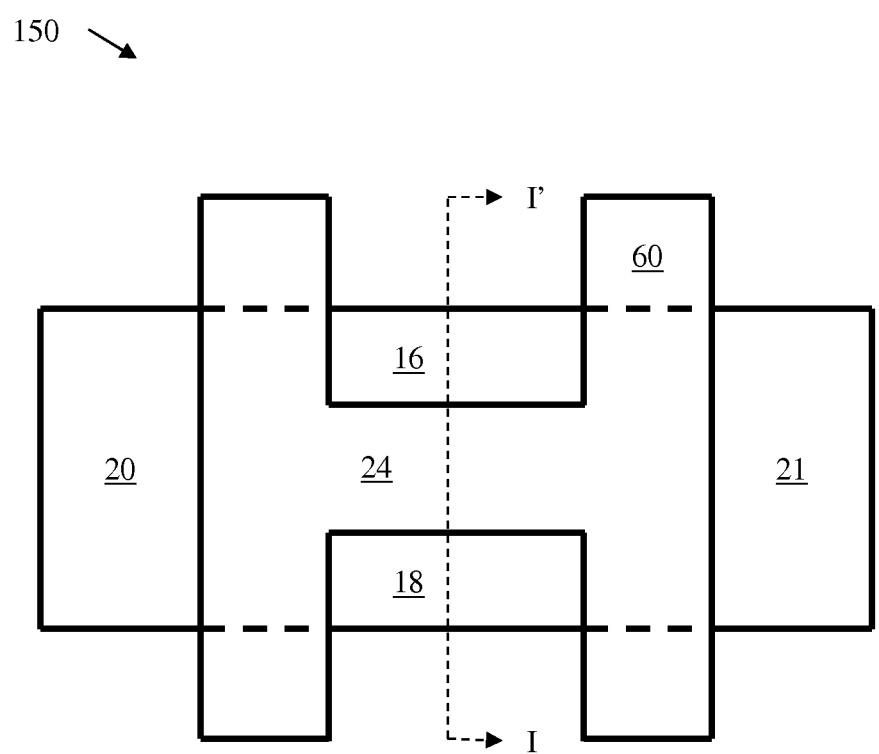
FIG. 17 is a schematic top view illustration of a memory cell according to another embodiment of the present invention.

FIG. 17 illustrates memory cell 150 according to another embodiment of the present invention. Memory cell 150 comprises two charge injection regions 20 and 21. The operation of memory cell 150 is similar to that of memory cell 50, where the charge injection region 20 and/or 21 maintains the state of the memory cell 150, and the read and write operations are performed by the MOS or bipolar transistors formed by the source region 16, the bit line region 18, and the gate 60.

Figure 18:
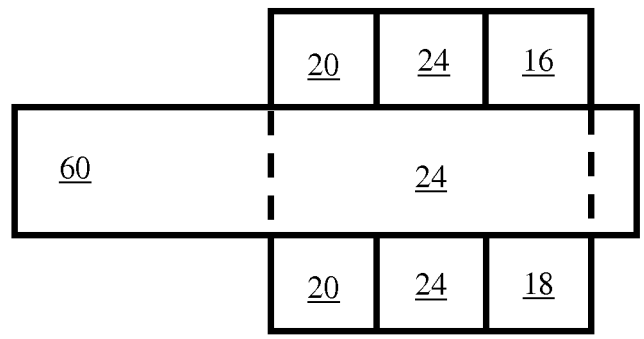
FIG. 18 is a schematic top view illustration of a memory cell according to another embodiment of the present invention.

FIG. 18 illustrates memory cell 250 according to another embodiment of the present invention. Memory cell 250 comprises charge injector regions 20, which function is to maintain the state of the memory cell 250.

Figure 19:
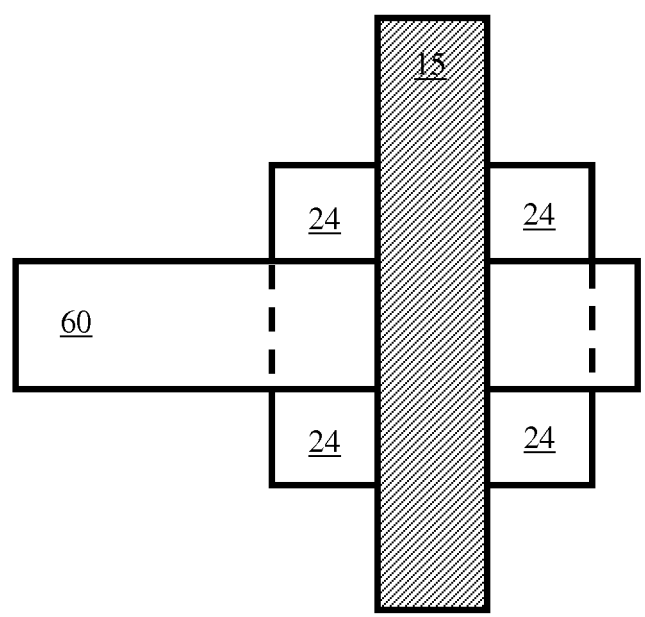
FIG. 19 illustrates a masking step to form the memory cell shown in FIG. 18.

In order to form the charge injector regions 20 in memory cell 250, an additional masking step may be needed. An exemplary process step to form charge injector regions 20 is shown in FIG. 19. After the gate formation step, a lithography step is performed to perform a blocking layer 15, such as photoresist for example. An ion implantation of a second conductivity (e.g. n-type implant) to form the source region 16, bit line region 18, and charge injector regions 20, allowing the charge injector regions 20 to be spaced apart from the source region 16 or the bit line region 18. The blocking layer 15 is then subsequently removed.

Figure 20:
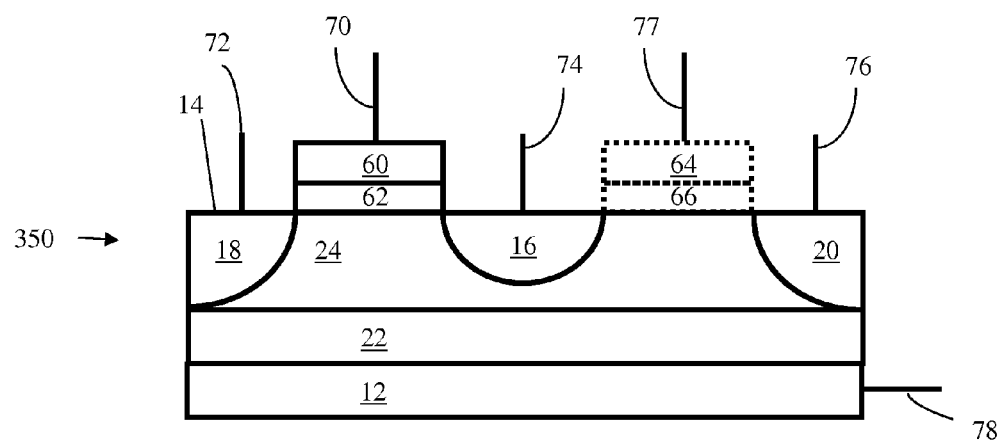
FIG. 20 is a schematic, cross-sectional illustration of a memory cell according to another embodiment of the present invention.

FIG. 20 illustrates memory cell 350 according to another embodiment of the present invention. The regions of second conductivity type in memory cell 350 may have differing junction depths. In FIG. 20, the source line region 16 is shown to be shallower than the bit line region 18 and the charge injector region 20 to allow for the floating body region 24 to be continuous across the memory cell 350. Furthermore, memory cell 350 may or may not comprise another gate region. FIG. 20 illustrates an exemplary embodiment where memory cell 350 comprises an optional second gate region 64 (shown in dashed line) spaced apart from the floating body region 24.

The operation of memory cell 350 is similar to that of memory cells 50, 150, and 250, where the charge injection region 20 maintains the state of the memory cell 350, and the read and write operations are performed by the MOS or bipolar transistors formed by the source region 16, the bit line region 18, and the gate 60. The gate region 64 (which may be connected to a word line 2 (WL2) terminal 77) may enhance the efficiency of the holding operation by enhancing the impact ionization efficiency.

Figure 21:
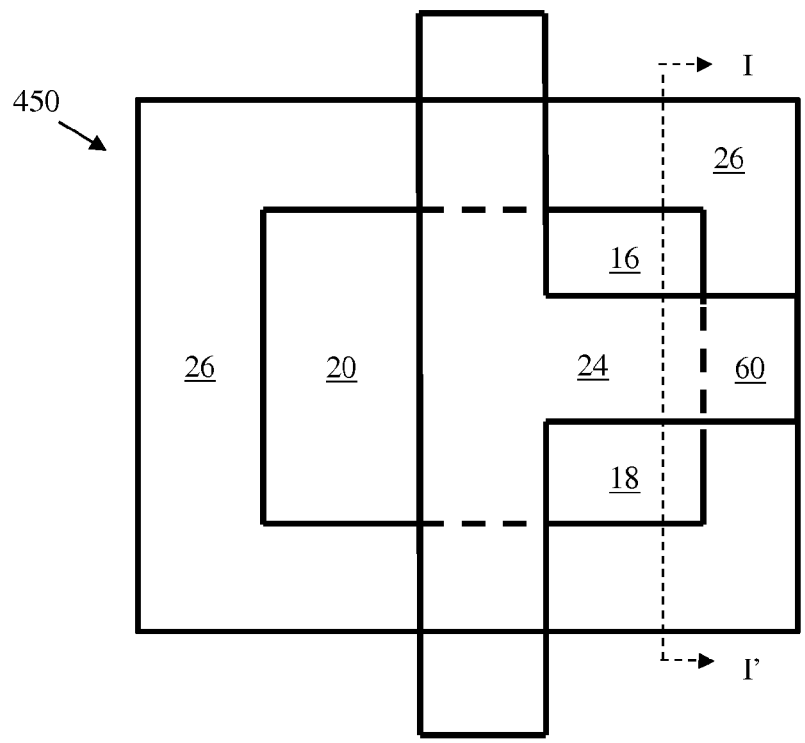
FIG. 21 is a schematic top view illustration of a memory cell according to another embodiment of the present invention.
Figure 22:
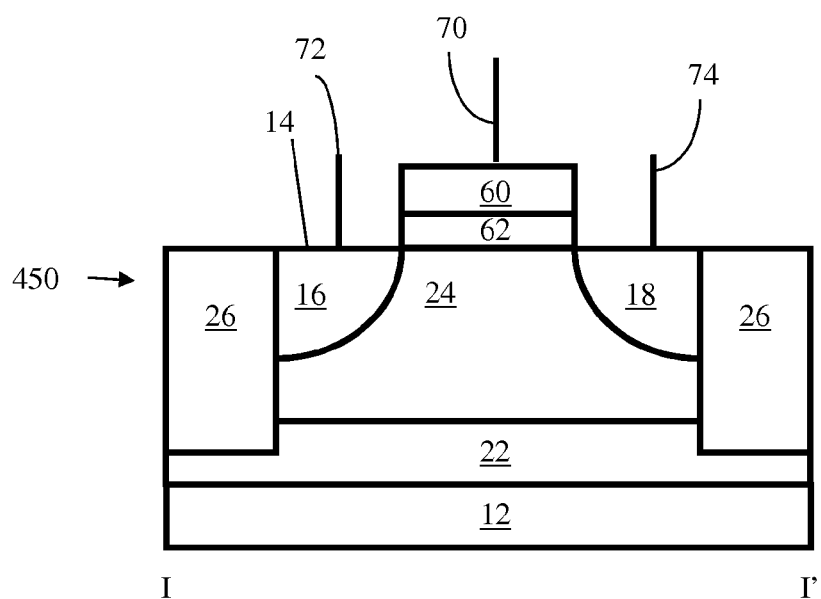
FIG. 22 is a schematic, cross-sectional illustration of a memory cell according to another embodiment of the present invention.

FIGS. 21 and 22 schematically illustrate a top view and a cross-sectional view of memory cell 450 according to another embodiment of the present invention, respectively. In memory cell 450, the depth of the body region 24 (the depth from the surface 14 to the top of the buried insulator layer 22) is greater than the junction depth of regions 16, 18, and 20. Depths of regions 16, 18 and 20 do not need to be equal, but may be. In any case, depths of 16, 18 and 20 are less than the depth of 24 in this embodiment. Memory cell 450 further comprises insulating layers 26, which insulate cell 450 from neighboring cells 450 when multiple cells 450 are joined in a memory array. Insulating layers 26, for example, shallow trench isolation (STI), may be made of silicon oxide, though other insulating materials may be used. The charge injection region 20 in memory cell 450 maintains the state of the memory cell 450, while the read and write operations are performed by the MOS or bipolar transistors formed by the source region 16, the bit line region 18, and the gate 60.

Figure 23:
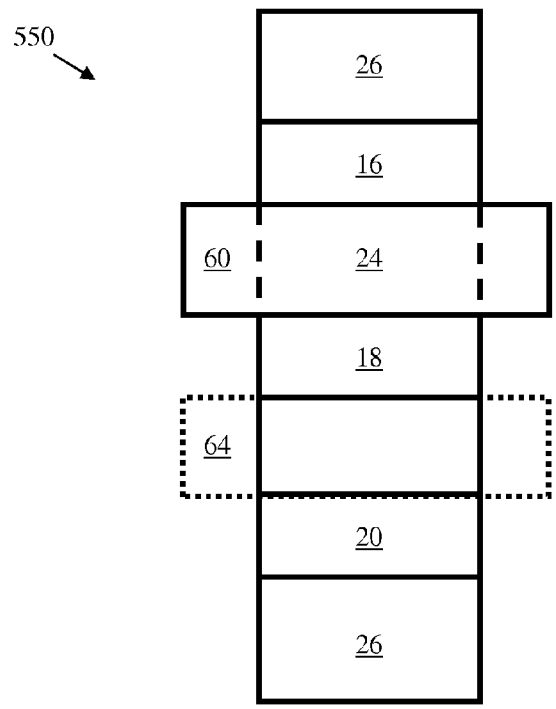
FIG. 23 is a schematic top view illustration of a memory cell according to another embodiment of the present invention.
Figure 24:
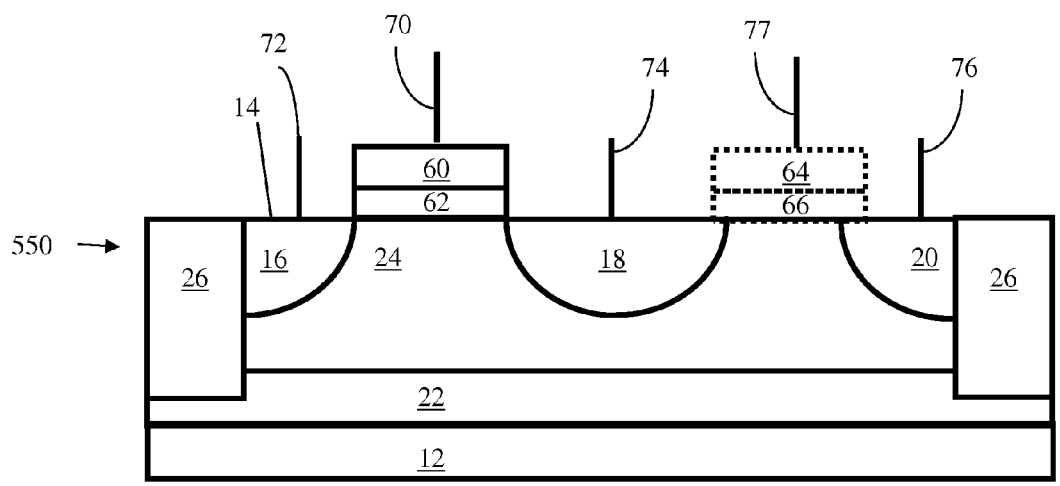
FIG. 24 is a schematic, cross-sectional illustration of a memory cell according to another embodiment of the present invention.

FIGS. 23 and 24 schematically illustrate a top view and a cross-sectional view of memory cell 550 according to another embodiment of the present invention, respectively. The depth (thickness) of the floating body region 24 in memory cell 550 is also greater than the junction depths of each of regions 16, 18, and 20. The charge injection region 20 in memory cell 550 maintains the state of the memory cell 550, while the read and write operations are performed by the MOS or bipolar transistors formed by the source region 16, the bit line region 18, and the gate 60. Memory cell 550 may also comprise an optional gate region 64 (shown in dashed line) above the floating body region 24, in the region between drain region 18 and charge injector 20. The additional gate region may be utilized to enhance the efficiency of the holding operation.

Figure 25:
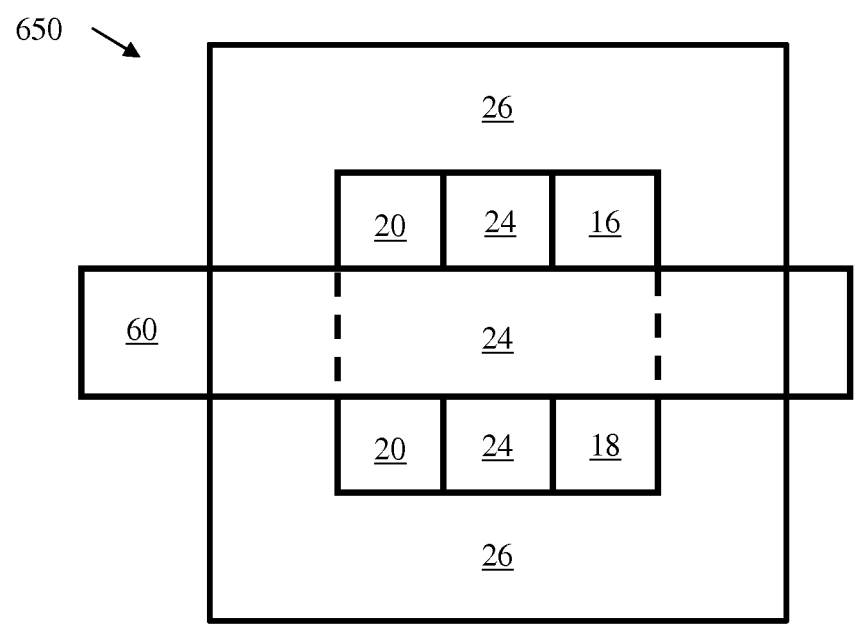
FIG. 25 is a schematic top view illustration of a memory cell according to another embodiment of the present invention.

FIG. 25 illustrates memory cell 650 according to another embodiment of the present invention. Memory cell 650 is similar to the memory cell 250, but comprises insulating layer 26, which insulate cell 450 from neighboring cells 450 when multiple cells 450 are joined in a memory array. Insulating layers 26, for example, shallow trench isolation (STI), may be made of silicon oxide, though other insulating materials may be used.

Figure 26:
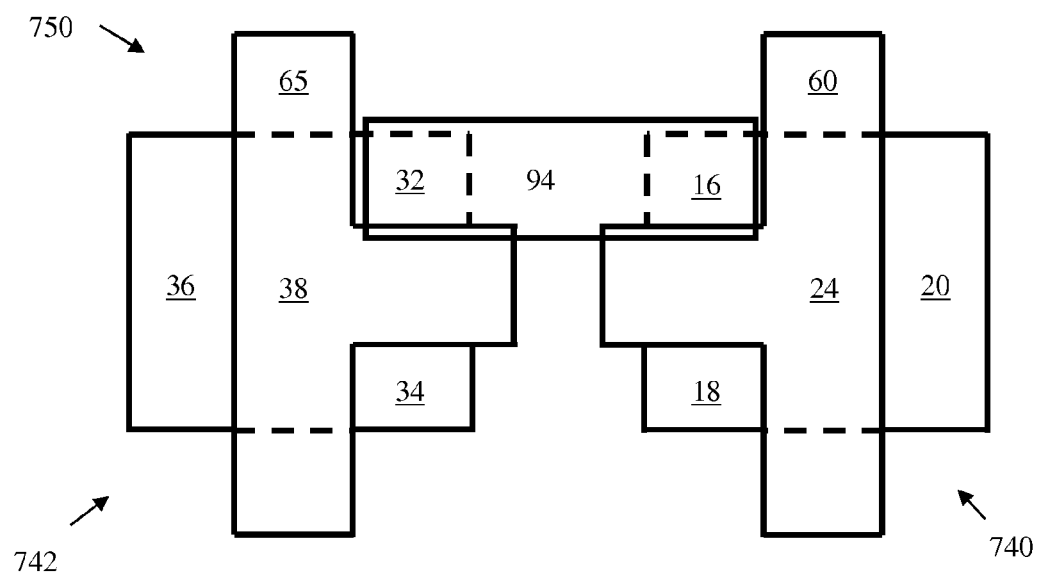
FIG. 26 is a schematic top view illustration of a memory cell according to another embodiment of the present invention.

FIG. 26 illustrates memory cell 750 according to another embodiment of the present invention. Memory cell 750 comprises a memory device 740 and an access device 742 connected in series. Memory device 740 functions to store the state of the memory cell 750, and is accessed through the access device 742. A memory cell comprising a memory device and an access device has been described, for example, in PCT/US13/26466, "Memory Cell Comprising First and Second Transistors and Methods of Operating", by Widjaja, which is hereby incorporated herein, in its entirety, by reference thereto.

Memory device 740 may be constructed from any of the memory cells 50, 150, 250, 350, 450, 550, or 650 described above. The state of the memory cell is stored in the floating body region 24 (e.g., having the first conductivity type). The charge injector region 20 (e.g., of the second conductivity type) is configured to maintain the state of the memory cell 750, while the read and write operations are performed by the MOS or bipolar transistors formed by the source region 16, the bit line region 18, and the gate 60.

Access device 742 comprises regions 32 and 34 (e.g., of second conductivity type), a body region 38 (e.g., of a first conductivity type), and a body tap region 36 (e.g., of a first conductivity type). The body region 38 of the access device 742 is not floating as the body tap region 36 may be used to apply a bias on the body region 38.

The source region 16 of the memory device 740 is connected to the source region 32 of the access device 742 through a conductive element 94.

Memory cell 750 comprises several terminals: word line #1 (WL1) terminal 770 (see FIG. 27) electrically connected to gate 60, word line #2 (WL2) terminal 772 electrically connected to gate 65 of the access device, source line (SL) terminal 774 electrically connected to the region 18 of the memory device 740, bit line (BL) terminal 776 electrically connected to region 34 of the access device 742, charge injector (CI) terminal 778 electrically connected to charge injector region 20, and body tap (TAP) terminal 780 electrically connected to the body tap region 36. Alternatively, the SL terminal 774 may be electrically connected to region 34 and BL terminal 776 may be electrically connected to region 18. Memory cell 750 also comprises substrate terminal (not shown in FIG. 26). The substrate terminal is biased at about 0.0 volts in all operations of the memory cell 750.

Figure 27:
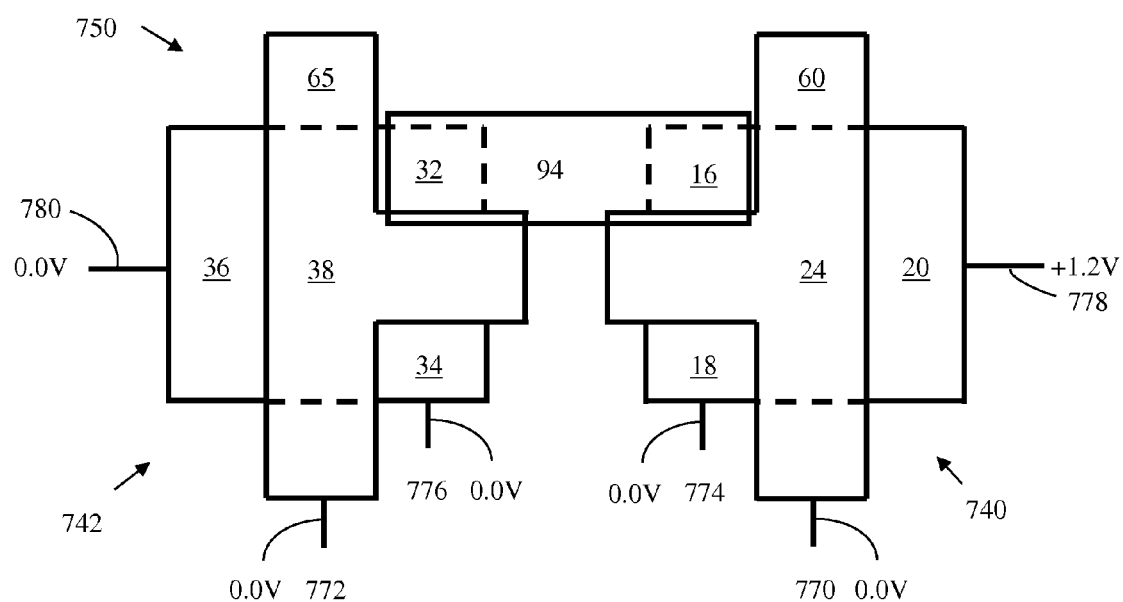
FIG. 27 illustrates bias conditions applied on the terminals of a memory cell shown in FIG. 26 to perform a holding operation.

FIG. 27 illustrates a holding operation being performed on memory cell 750 according to an embodiment of the present invention. The holding operation is performed by applying a positive bias to the CI terminal 778, zero or low negative bias on the WL1 terminal 770 and WL2 terminal 772 to turn-off the channel regions of the floating body transistor 740 and the access transistor 742, and zero bias on the SL terminal 774, TAP terminal 780, and BL terminal 776. The positive bias applied to the charge injector region 20 connected to the CI terminal 778 will maintain the state of the memory cell 750 by maintaining the charge stored in the floating body region 24 of the corresponding floating body transistor 740.

In one embodiment the bias conditions for the holding operation for memory cell 750 are: 0.0 volts is applied to WL1 terminal 770, WL2 terminal 772, SL terminal 774, BL terminal 776, and TAP terminal 780, and a positive voltage like, for example, +1.2 volts is applied to CI terminal 778.

In other embodiments, different voltages may be applied to the various terminals of memory cell 750 as a matter of design choice and the exemplary voltages described are not limiting.

Figure 28:
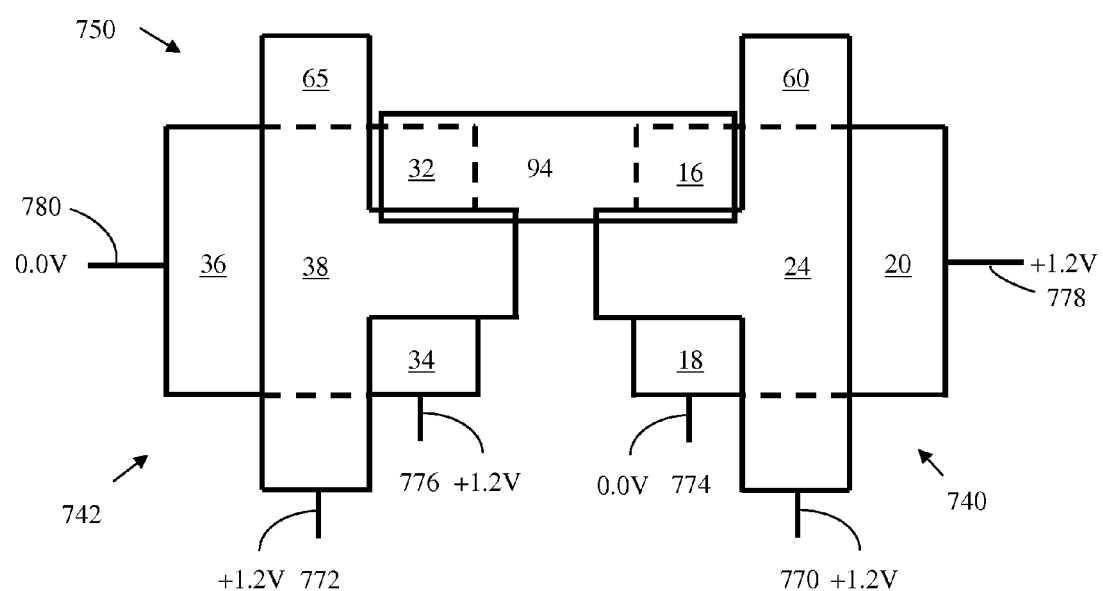
FIG. 28 illustrates bias conditions applied on the terminals of a memory cell shown in FIG. 26 to perform a read operation.

A read operation of the memory cell 750, according to an embodiment of the present invention, will be described in conjunction with FIG. 28. Any sensing scheme known in the art can be used with memory cell 750. The amount of charge stored in the floating body 24 can be sensed by monitoring the cell current of the memory cell 750. If memory cell 750 is in a logic-1 state having holes in the floating body region 24, then the memory cell will have a higher cell current (e.g. current flowing from the BL terminal 776 to SL terminal 774), compared to if cell 750 is in a logic-0 state having no holes in floating body region 24. A sensing circuit typically connected to BL terminal 776 can then be used to determine the data state of the memory cell.

A read operation for example can be performed on memory cell 750 by applying the following bias conditions. A positive voltage is applied to the WL2 terminal 772, which turns on the access transistor 742, a positive voltage is applied to the BL terminal 776, zero voltage is applied to the SL terminal 774, positive voltage is applied to the CI terminal 778, and zero voltage is applied to the TAP terminal 780. Positive voltage may also be applied to the WL1 terminal 770 to further enhance the current flowing through the memory cell 750, from the BL terminal 776 to the SL terminal 774. If memory cell 750 is in a logic-1 state having holes in the floating body region 24, then a higher current will flow from the BL terminal 776 to the SL terminal 774 of the selected memory cell 750, compared to if memory cell 750 is in a logic-0 state having no holes in the floating body region 24. In one particular embodiment, +1.2 volts is applied to the WL1 terminal 770, WL2 terminal 772, BL terminal 776, CI terminal 778, and 0.0 volts is applied to the SL terminal 774 and TAP terminal 780. In other embodiments, different voltages may be applied to the various terminals of memory cell 750 as a matter of design choice and the exemplary voltages described are not limiting in any way.

The access transistor 742 is used to assist the selection of the memory cell 750 during a read operation. Because the access transistor 742 of the unselected memory cells in different rows are turned off, it will not pass the positive voltage applied to the BL terminal 776 to the region 16 of the floating body transistor 740. As a result, no current will flow through the floating body transistor 740 of the unselected memory cells in different rows.

Figure 29:
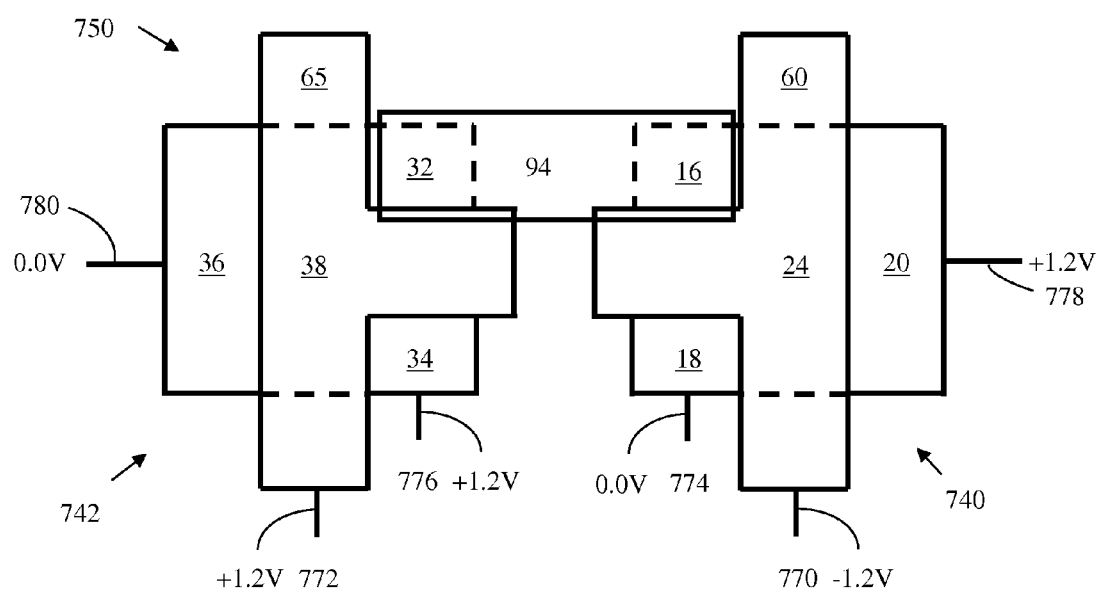
FIG. 29 illustrates bias conditions applied on the terminals of a memory cell shown in FIG. 26 to perform a write logic-1 operation using band-to-band tunneling mechanism.

FIG. 29 illustrates an exemplary write logic-1 operation using band-to-band tunneling mechanism, where the following bias conditions are applied: a positive bias is applied to WL2 terminal 772, which turns on the access transistor 742 of the selected memory cell 750, a negative bias is applied to the WL1 terminal 770, a positive bias is applied to the BL terminal 776, zero bias is applied to the SL terminal 774, zero or positive bias is applied to the CI terminal 778, and zero bias is applied to the TAP terminal 780.

In one particular non-limiting embodiment, about +1.2 volts is applied to the selected WL2 terminal 772, about −1.2 volts is applied to the selected WL1 terminal 770, about +1.2 volts is applied to the selected BL terminal 776, about +1.2 volts is applied to the selected CI terminal 778, about 0.0 volts is applied to SL terminal 774 and about 0.0 volts is applied to the TAP terminal 780.

The positive bias applied to the WL2 terminal 772 will turn on the access transistor 742, which will pass the positive bias applied to the BL terminal 776 to the region 16 of the floating body transistor 740. The positive bias now present on the region 16 of the floating body transistor 740, along with the negative voltage applied to the WL1 terminal 770 (connected to the gate 60), will create a strong electric field around the junction area of the region 16 in the proximity of the gate 60. The strong electric field bends the energy band sharply upward near the gate 60 and region 16 junction overlap region, causing electrons to tunnel from the valence band of the floating body region 24 to the conduction band of the region 16, leaving holes in the valence band of the floating body region 24. The electrons which tunnel across the energy band become the region 16 leakage current, while the holes are injected into floating body region 24 and become the hole charge that creates the logic-1 state.

Figure 30:
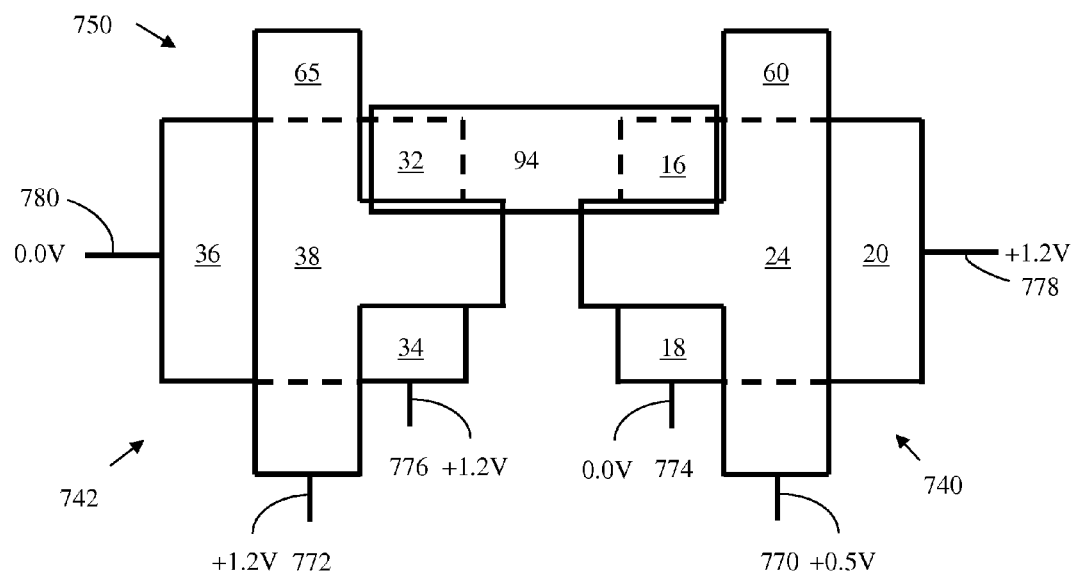
FIG. 30 illustrates bias conditions applied on the terminals of a memory cell shown in FIG. 26 to perform a write logic-1 operation using impact ionization mechanism.

FIG. 30 illustrates exemplary bias conditions for a write logic-1 operation through an impact ionization mechanism, performed on the memory cell 750, respectively, where the following bias conditions are applied: a positive voltage is applied to the selected WL2 terminal 772, a positive voltage is applied to the selected WL1 terminal 770, a positive voltage is applied to the selected BL terminal 776, zero voltage is applied to the SL terminal 774, positive voltage is applied to the CI terminal 778, and zero voltage is applied to the TAP terminal 780. The positive voltage applied to the WL1 terminal 770 and the BL terminal 776 is configured to maximize hole generation through the impact ionization process, where the voltage on the region 16 of the floating body transistor 740 is typically greater than the voltage applied to the gate 60 (connected to the WL1 terminal 770) of the floating body transistor 740.

In one particular non-limiting embodiment, about +1.2 volts is applied to the selected WL2 terminal 772, about +0.5 volts is applied to the selected WL1 terminal 770, about +1.2 volts is applied to the selected BL terminal 776, about +1.2 volts is applied to the selected CI terminal 778, about 0.0 volts is applied to SL terminal 774 and about 0.0 volts is applied to the TAP terminal 780. These voltage levels are exemplary only and may vary from embodiment to embodiment. Thus the exemplary embodiments, features, bias levels, etc., described are not limiting.

Figure 31:
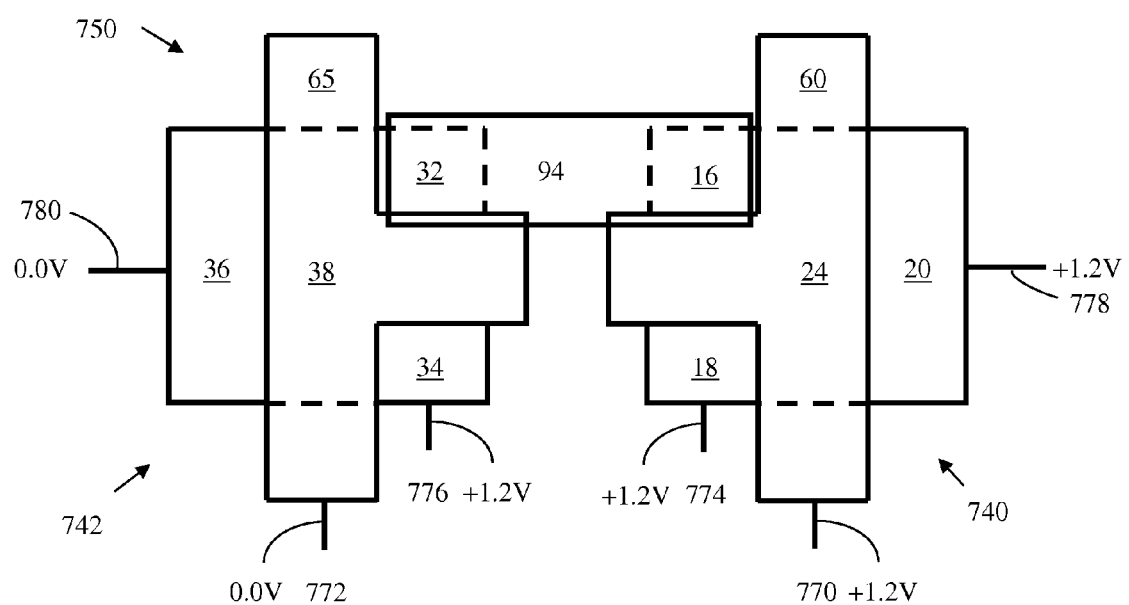
FIG. 31 illustrates bias conditions applied on the terminals of a memory cell shown in FIG. 26 to perform a write logic-1 operation using capacitive coupling mechanism.

FIG. 31 illustrates bias conditions for an exemplary write logic-1 operation through capacitive coupling from the gate 60 of the floating body transistor 740 to the floating body region 24, where the following bias conditions are applied: zero or low positive voltage is applied to the selected WL2 terminal 772, a positive bias is applied to the selected BL terminal 776, a positive voltage is applied to the SL terminal 774, a positive voltage is applied to the CI terminal 778, and zero voltage is applied to the TAP terminal 780. The WL1 terminal 770 is initially grounded, and then its potential is increased to a positive voltage. The access transistor 742 of the selected memory cell is biased such that the region 32 of the access transistor 742 is floating, for example by having the bias applied to the BL terminal 776 to be greater than the difference between the bias applied to the gate 65 and the threshold voltage of the access transistor 742. Because the channel region of the floating body transistor 740 is now floating, when the potential of the gate region 60 (connected to the WL1 terminal 770) is increased from zero (or negative voltage) to a positive voltage, the potential of the floating body region 24 will increase due to capacitive coupling. The positive bias applied to the charge injector region 20 (through the CI terminal 778) will then generate holes through the impact ionization process, which maintains the positive charge of the floating body region 24.

In one particular non-limiting embodiment, about 0.0 volts is applied to the WL2 terminal 772, the voltage applied to the WL1 terminal 770 is increased from 0.0 volts to about +1.2, about +1.2 volts is applied to the SL terminal 774, about +1.2 volts is applied to the BL terminal 776, about +1.2 volts is applied to the CI terminal 778, and about 0.0 volts is applied to the TAP terminal 780. These voltage levels are exemplary only and may vary from embodiment to embodiment. Thus the exemplary embodiments, features, bias levels, etc., described are not limiting.

The ramp rate of the positive bias applied to the WL1 terminal 770 (connected to gate electrode 60) may be optimized to increase the coupling ratio from the gate 60 to the floating body region 24. As described for example in "Substrate Response of a Floating Gate n-channel MOS Memory Cell Subject to a Positive Linear Ramp Voltage", H.-S. Lee and D. S. Lowrie, Solid-State Electronics 24, no. 3, pp. 267-273, 1981, which is hereby incorporated herein, in its entirety, by reference thereto, a higher coupling from the gate 60 to the floating body region 24 can be achieved with a higher ramp rate. The ramp rate applied to the gate 60 may also be higher in the write logic-1 operation than in other operations, such as read operation, to further improve the write logic-1 operation time. For example, during write logic-1 operation, the voltage applied to the gate 60 may be ramped from about 0.0 volts to about +1.2 volts in about 50 picoseconds (ps) or less. This ramp rate is exemplary only and may vary from embodiment to embodiment and is not limiting.

Figure 32:
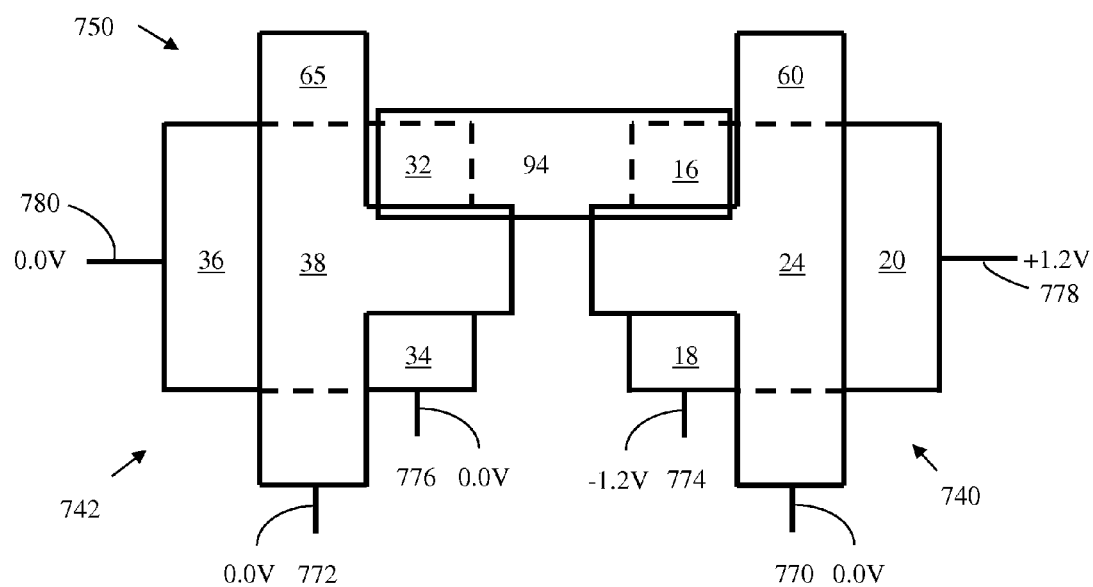
FIG. 32 illustrates bias conditions applied on the terminals of a memory cell shown in FIG. 26 to perform a write logic-0 operation.

FIG. 32 illustrates exemplary bias conditions for a write logic-0 operation according to an embodiment of the present invention, by applying the following bias conditions: a negative voltage is applied to the SL terminal 774, zero voltage is applied to the WL1 terminal 770, WL2 terminal 772, BL terminal 776, and TAP terminal 780, a zero or positive voltage is applied to the CI terminal 778. Under these conditions, the p-n junction between the floating body 24 and the region 18 is forward-biased, evacuating holes from the floating body 24. All memory cells sharing the same SL terminal 774 will be written to simultaneously. To write arbitrary binary data to different memory cells 750, a write logic-0 operation is first performed on all the memory cells to be written, followed by one or more write logic-1 operations on the memory cells that must be written to logic-1.

In one particular non-limiting embodiment, about −1.2 volts is applied to the selected SL terminal 774, about 0.0 volts is applied to the WL1 terminal 770, WL2 terminal 772, BL terminal 776, and TAP terminal 780, and about +1.2 volts is applied to the CI terminal 778. These voltage levels are exemplary only and may vary from embodiment to embodiment. Thus the exemplary embodiments, features, bias levels, etc., described are not limiting.

Figure 33:
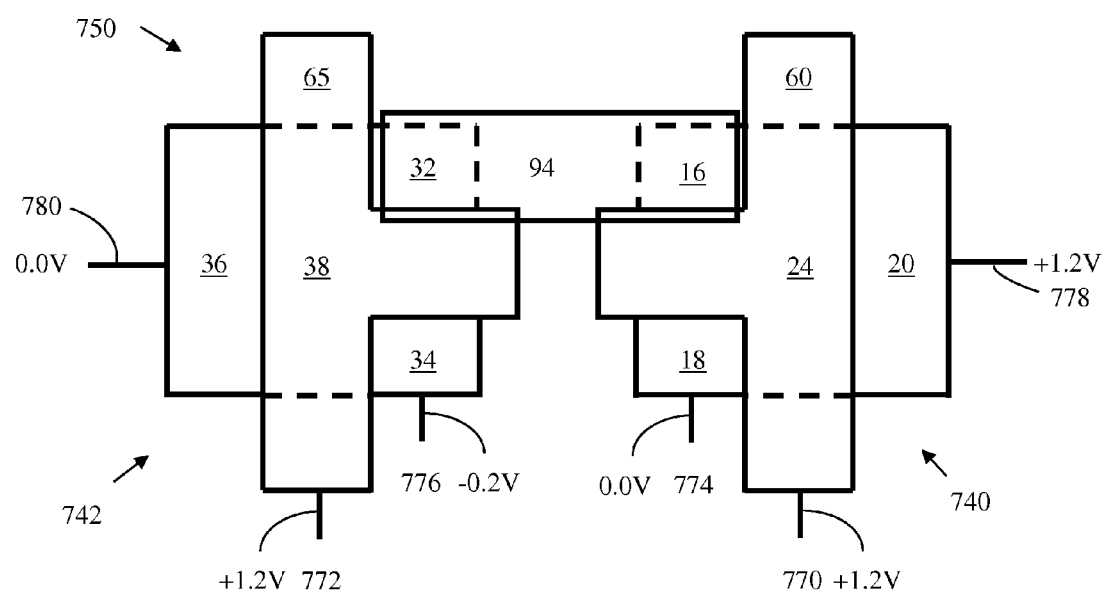
FIG. 33 illustrates bias conditions applied on the terminals of a memory cell shown in FIG. 26 to perform a write logic-0 operation according to another embodiment of the present invention.

FIG. 33 illustrates exemplary bias conditions for a bit-selective write logic-0 operation according to another embodiment of the present invention by applying the following bias conditions: a positive bias is applied to the WL2 terminal 772, a positive bias is applied to the WL1 terminal 770, a negative bias is applied to the BL terminal 776, zero voltage is applied to the SL terminal 774, a zero or positive bias is applied to the CI terminal 778, and zero voltage is applied to the TAP terminal 780. Under these conditions, the access transistor 742 will pass the negative voltage applied on the BL terminal 776 to the region 16 of the floating body transistor 740, forward biasing the p-n junction between the floating body 24 and the region 16. A positive bias can also be applied to the gate 60 of the floating body transistor 740 (connected to the WL1 terminal 770), which will increase the potential of the floating body 24 through capacitive coupling, which in turn will increase the electric field across the p-n junction between the floating body 24 and the region 16. The negative bias applied to the BL terminal 776 and the bias applied to the WL2 terminal 772 are configured such that access transistors of the unselected cells 750 in different rows do not pass the negative bias to the region 16 of the floating body transistor 740.

In one particular non-limiting embodiment, about +1.2 volts is applied to the WL2 terminal 772, about +1.2 volts is applied to the WL1 terminal 770, about 0.0 volts is applied to the SL terminal 774, about −0.2 volts is applied to the BL terminal 776, about +1.2 volts is applied to the CI terminal 778, and about 0.0 volts is applied to the TAP terminal 780. These voltage levels are exemplary only and may vary from embodiment to embodiment. Thus the exemplary embodiments, features, bias levels, etc., described are not limiting.

Memory cell 750 illustrated in FIG. 26 has two transistors having the same conductivity type in series (two n-channel transistors 740 and 742 are used in the examples). In another embodiment of the present invention, the memory device 740 and the access transistor 742 may comprise transistors having different conductivity types.

Figure 34:
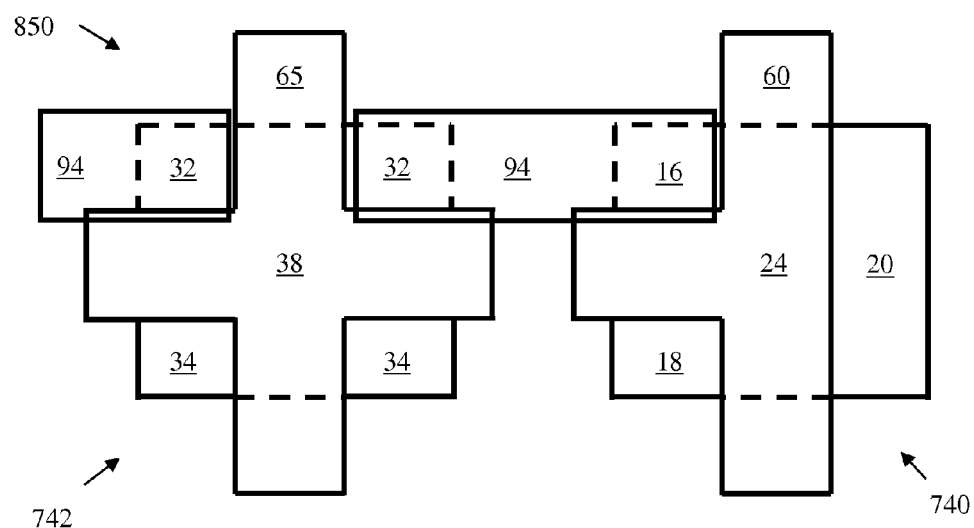
FIG. 34 is a schematic top view illustration of a memory cell according to another embodiment of the present invention.

FIG. 34 illustrates memory cell 850 according to another embodiment of the present invention. Memory cell 850 also has two transistors connected in series: memory device 740 and access transistor 742. Unlike memory cell 750, the access transistor 742 of the memory cell 850 does not have a body tap region, and subsequently does not have a body tap (TAP) terminal. As a result, the size of memory cell 850 is more compact compared to that of memory cell 750.

Figure 35:
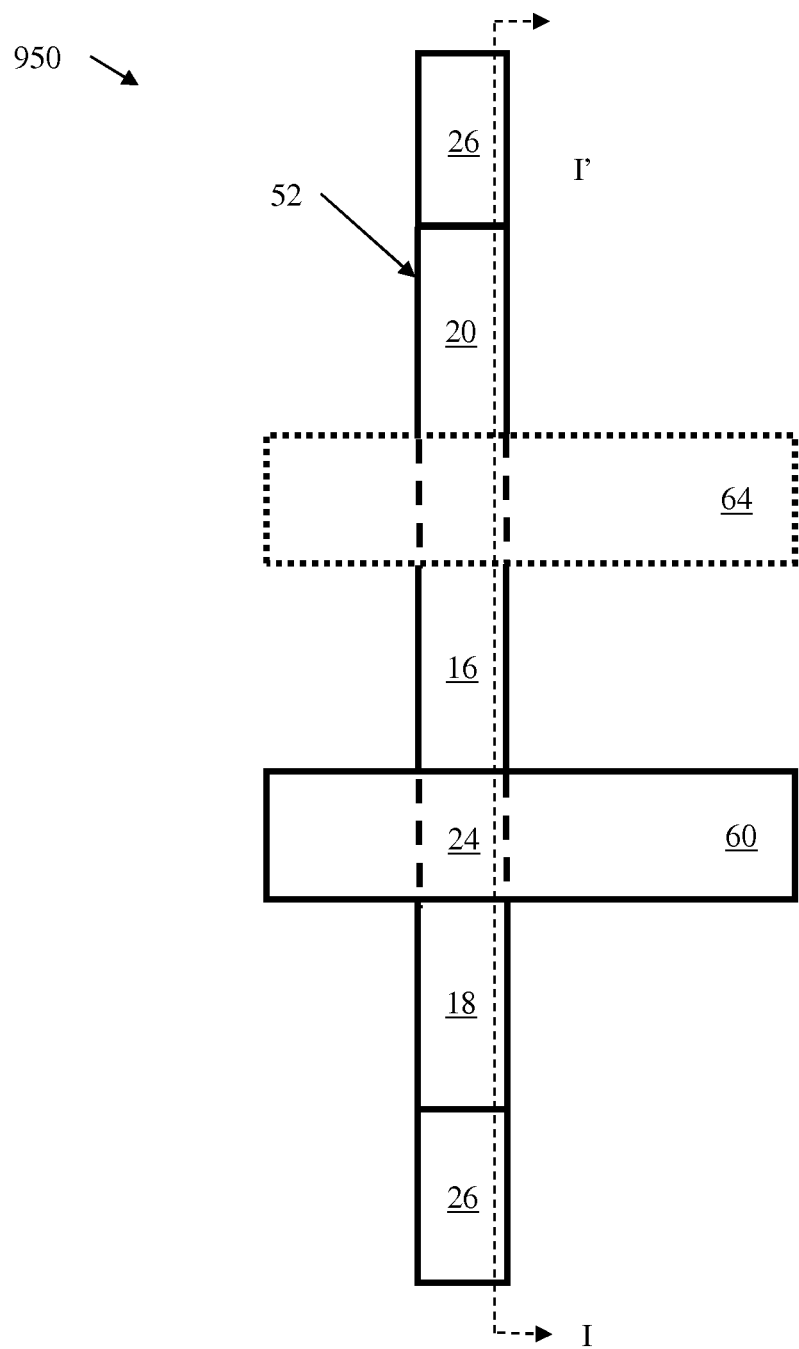
FIG. 35 is a schematic top view illustration of a memory cell comprising a fin structure according to another embodiment of the present invention.
Figure 36A:
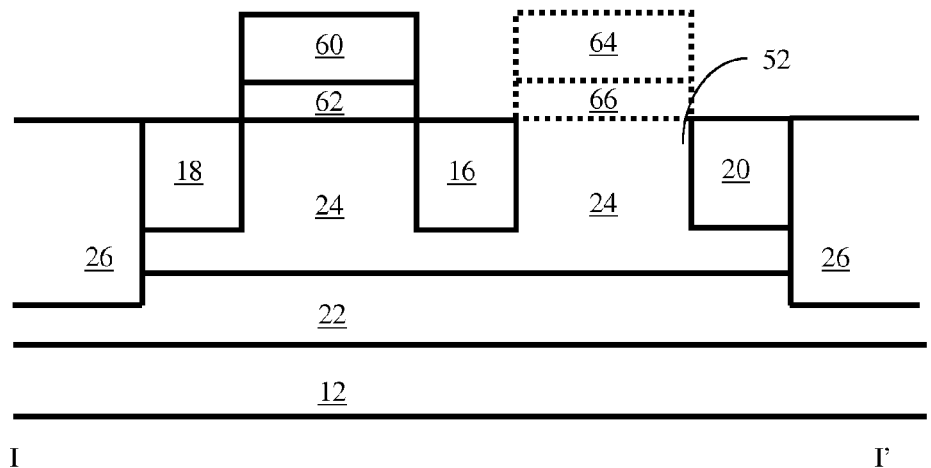
FIG. 36A is a schematic cross-sectional illustration of a memory cell comprising a fin structure according to another embodiment of the present invention.
Figure 36B:
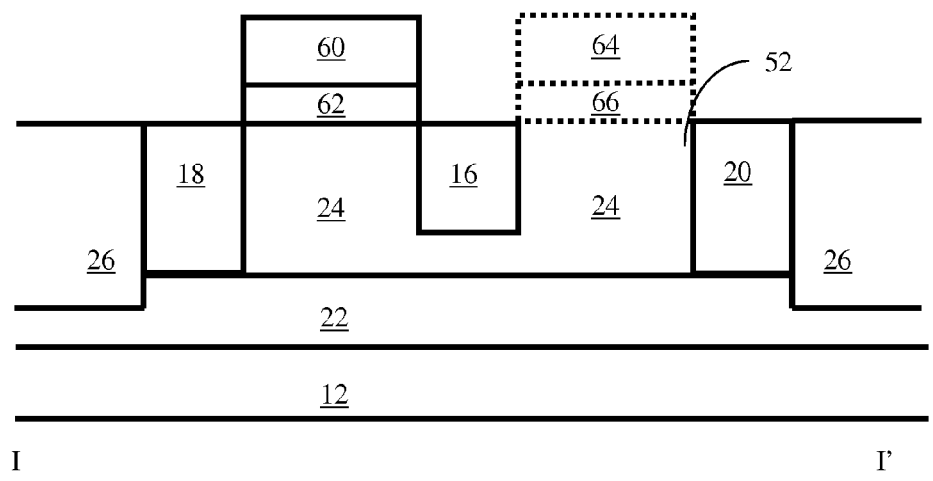
FIG. 36B is a schematic cross-sectional illustration of a memory cell that is a variant of the embodiment of FIG. 36B.

The memory cells that have been described herein (memory cells 50, 150, 250, 350, 450, 550, 650, 750, and 850) are all fabricated on planar SOI substrate. Memory cell 950 illustrated in FIGS. 35 and 36 show an alternative embodiment of memory cell 550 (used for illustrative purpose) fabricated to form a three-dimensional memory cell structure, having a fin 52 extending substantially perpendicular to, and above the top surface of the substrate 12, which is often referred as FinFET or Multi-gate FET. In this example, memory cell 950 also comprises a second gate region 64. Both gate regions 60 and 64 enclose floating body region 24 on three sides of the floating body region 24. Alternatively, gates 60 and 64 may enclose on two opposite sides of the floating body region 24. As shown in FIG. 36A, the junction depth of source line region 16, bit line region 18, and charge injector region 20 are the same and their junction depths may be shallower than the thickness (depth) of the floating body region 24. Alternatively, the junction depth of the source line region 16 may be shallower than the depth of the bit line region 18 and may be shallower than the depth of the charge injector region 20 for the floating body to be continuous, as shown in FIG. 36B.

The memory cell described in this disclosure may also be used to form a content addressable memory (CAM) cell or ternary content addressable memory (TCAM) cell as described in U.S. patent application Ser. No. 14/154,138 by Widjaja et al., "Content Addressable Memory Device Having Electrically Floating Body Transistor", which is hereby incorporated herein, in their entirety, by reference thereto.

From the foregoing it can be seen that a memory cell comprising an electrically floating body transistor fabricated on a silicon-on-insulator (SOI) substrate having more than one stable state through an application of a bias on a charge injector region has been described. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

That which is claimed is:

1. A memory cell comprising: a silicon-on-insulator (SOI) substrate;
   an electrically floating body transistor fabricated on said silicon-on-insulator (SOI) substrate and comprising a first conductivity type selected from p-type conductivity type and n-type conductivity type;
   a source line region comprising a second conductivity type selected from said p-type conductivity type and said n-type conductivity type and being different from said first conductivity type, said source line region in physical contact with a floating body region of said floating body transistor;
   a drain region comprising said second conductivity type in physical contact with said floating body region and spaced apart from said source line region; and
   a charge injector region, wherein said charge injection region comprises said second conductivity type and is in physical contact with said floating body region and spaced apart from said source line region and said drain region;
   wherein said floating body transistor is configured to have more than one stable state through an application of a bias on said charge injector region; and
   wherein said drain region and said source line region are bounded at the bottom by an insulator layer.

2. A memory array comprising a plurality of said memory cells of claim 1, arranged in at least one row and at least one column.

3. The memory cell of claim 1, further comprising a gate positioned in between said source line region and said drain region, above said floating body region.

4. The memory cell of claim 1 configured such that a holding operation on said memory cell does not require any interruption to access to said memory cell.

5. The array of claim 2, comprising a charge injector terminal connected to all of said memory cells in a row or column of said array;
   wherein said charge injector terminal is configured to perform a holding operation on all of said memory cells connected to said charge injector terminal in a batch operation, so that no individual selection of one of said memory cells is required to perform the holding operation.

6. The memory cell of claim 1, wherein application of a charge to said charge injector region in performance of a holding operation also increases a size of a memory window of said floating body region.

7. The memory cell of claim 1, further comprising a second charge injection region in contact with said floating body region and spaced apart from said first charge injection region.

8. The memory cell of claim 1, wherein said charge injector region comprises a first charge injector region, said memory cell further comprising a second charge injector region, wherein said first and second charge injector regions are configured to maintain a state of said memory cell.

9. The memory cell of claim 1, wherein a depth of said charge injector region is less than a depth of said drain region and said source line region.

10. The memory cell of claim 1, wherein said charge injector region is less than said depth of said floating body region.

11. The memory cell of claim 3, further comprising a second gate region.

12. The memory cell of claim 11, wherein said second gate region is positioned in between said charge injection region and one of said source line region and said drain region.

13. A memory device comprising the memory cell of claim 1 connected in series to an access device.

14. A memory device comprising the memory cell of claim 1, connected in series to an access device;
   wherein said access device comprises:
     a body region comprising said first conductivity type;
     a second source line region comprising said second conductivity type in contact with said body region;
     a second drain region comprising said second conductivity type in contact with said body region and spaced apart from said second source line region; and
     a body tap region comprising said first conductivity type in contact with said body region.

15. The memory device of claim 14, wherein said body tap region is configured to apply a bias on said body region.

16. The memory device of claim 13, wherein said memory cell and said access device comprise two transistors each having a same conductivity type.

17. The memory device of claim 13, wherein said memory cell and said access device comprise two transistors each having a different conductivity type.

18. A memory device comprising the memory cell of claim 1, connected in series to an access device;
   wherein said access device comprises:
     a body region comprising said first conductivity type;
     a second source line region comprising said second conductivity type in contact with said body region; and
     a second drain region comprising said second conductivity type in contact with said body region and spaced apart from said second source line region.

19. A content addressable memory cell comprising:
   the memory cell of claim 1; and
   a second floating body transistor;
   wherein said first floating body transistor and said second floating body transistor are electrically connected in series through a common node; and
   wherein said first floating body transistor and said second floating body transistor store complementary data.

20. A memory cell comprising:
   a silicon-on-insulator (SOI) substrate;
   an electrically floating body transistor fabricated on said silicon-on-insulator (SOI) substrate;
   a drain region in electrical contact with a floating body region of said electrically floating body transistor;
   a source line region in electrical contact with said electrically floating body region and spaced from said drain region;
   a charge injector region in physical contact with said floating body region;
   wherein said floating body region is configured to have more than one stable state through an application of a bias on said charge injector region;
   wherein said drain region and said source line region are bounded at the bottom by an insulator layer.

21. The memory cell of claim 20, further comprising a gate positioned between said drain region, said source line region and said charge injector region;
- wherein transistors are formed by said charge injector region, said gate, said source line region and said floating body region; and by said charge injection region, said gate, said drain region and said floating body region; and
- at least one of said transistors is used to stably maintain said state of said floating body region, while another of said transistors is used for read and write operations.

* * * * *